(12) United States Patent
Sato et al.

(10) Patent No.: US 7,091,587 B2
(45) Date of Patent: Aug. 15, 2006

(54) SEMICONDUCTOR DEVICE

(75) Inventors: Yusuke Sato, Komoro (JP); Kenji Koyama, Komoro (JP); Toshihiro Miura, Saku (JP); Toshihiko Kyogoku, Komoro (JP)

(73) Assignees: Renesas Technology Corp., Tokyo (JP); Akita Electronics Systems Co., Ltd., Akita (JP)

( * ) Notice: Subject to any disclaimer, the term of this patent is extended or adjusted under 35 U.S.C. 154(b) by 187 days.

(21) Appl. No.: 10/820,799

(22) Filed: Apr. 9, 2004

(65) Prior Publication Data

US 2004/0201094 A1  Oct. 14, 2004

(30) Foreign Application Priority Data

Apr. 11, 2003 (JP) ............................. 2003-107245

(51) Int. Cl.
*H01L 23/02* (2006.01)

(52) U.S. Cl. ...................... 257/685; 257/723; 257/758
(58) Field of Classification Search ................ 257/685, 257/686, 700, 723–724, 758, 784, 786
See application file for complete search history.

(56) References Cited

U.S. PATENT DOCUMENTS

| 5,635,751 | A | * | 6/1997 | Ikeda et al. ................. 257/584 |
| 6,111,459 | A | * | 8/2000 | Nishijima et al. ............ 330/51 |
| 6,605,999 | B1 | * | 8/2003 | Matsushita et al. ......... 330/285 |
| 6,804,126 | B1 | * | 10/2004 | Lucas ...................... 363/21.01 |
| 2002/0044017 | A1 | | 4/2002 | Suzuki et al. |

FOREIGN PATENT DOCUMENTS

JP        2002-111415        4/2002

* cited by examiner

*Primary Examiner*—Hoai Pham
*Assistant Examiner*—Dilinh Nguyen
(74) *Attorney, Agent, or Firm*—Antonelli, Terry, Stout and Kraus, LLP.

(57) ABSTRACT

An electrode on a main surface of a module board, to which an emitter electrode of a semiconductor chip which includes a switching element of a power supply control circuit that supplies a power supply voltage to amplifier circuit parts of a power module of a digital cellular phone, is electrically connected to a wiring in an internal layer of the module board through a plurality of via holes. Further, the wiring is electrically connected to an electrode for the supply of the power supply voltage, which is provided on a back surface of the module board. Accordingly, an output characteristic of the semiconductor device is improved.

11 Claims, 15 Drawing Sheets

SEMICONDUCTOR DEVICE

CROSS-REFERENCE TO RELATED APPLICATION

The present application claims priority from Japanese patent application JP 2003-107245, filed on Apr. 11, 2003, the content of which is hereby incorporated by reference into this application.

BACKGROUND OF THE INVENTION

The present invention relates to a semiconductor device technique, and, more particularly, to a technique that is effective for application to an RF (Radio Frequency) power module.

An RF power module is an electronic part for signal amplification, which is used in a communication device, such as, for example, a cellular phone or the like. The RF power module includes an amplifier circuit for signal amplification and a power supply or source control circuit, which supplies a desired power supply voltage to the amplifier circuit. A switching element of the power supply control circuit selects between a supply and non-supply of the desired power supply voltage to the amplifier circuit. The switching element comprises, for example, a bipolar transistor or MOS·FET (Metal Oxide Semiconductor Field Effect Transistor). The semiconductor chip in which the switching element is formed is packaged separately from the semiconductor chip that constitutes the amplifier circuit. The semiconductor chip is mounted on a printed circuit board equipped with the power module.

Incidentally, a high-frequency power amplifier device having a plurality of amplification systems, and a multiband communication type wireless communication device having the high-frequency power amplifier device, have been disclosed in, for example, Japanese Patent Application Laid-Open No. 2002-111415 (see Patent Document 1).

Patent Document 1

Japanese Patent Application Laid-Open No. 2002-111415

SUMMARY OF THE INVENTION

The present inventors have found that, as a result of a design in which the semiconductor chip for the switching element is mounted on a module board equipped with the semiconductor chip for the amplifier circuit to reduce the number of constituent elements or components of the communication device, for the purpose of promoting a scale-down of the communication device, a problem arises in that the resistance noticeably increases occurs in a wiring path electrically connected with the semiconductor chip for the switching element, of those wiring paths provided on the module board. Further, the present inventors have found that a problem arises in that, when the power supply voltage supplied to the semiconductor chip for the switching element is lowered due to the consumption or the like of the battery power of the communication device, a voltage drop developed in a wiring path in the module board, which is electrically connected with the semiconductor chip for the switching element, becomes great, so that the output of the RF power module might not be obtained sufficiently.

An object of the present invention is to provide a technique that is capable of improving the output characteristic of a semiconductor device.

The above object of the present invention, and other objects and novel features thereof will become apparent from the following description and the accompanying drawings.

A summary of a representative example of the invention disclosed in the present application will be provided as follows:

The present invention provides a semiconductor device which includes a first semiconductor chip including a transistor serving as a switching element of a power supply control circuit, a second semiconductor chip including an amplifier circuit to which a power supply voltage is supplied from the power supply control circuit, which serves as a source or power supply, and a wiring board having the first and second semiconductor chips mounted on its main surface. Connecting portions extending in the direction intersecting main and back surfaces of the wiring board are provided in a wiring path of the wiring board, which connects each of the power supply electrodes of the first semiconductor chip and its corresponding power supply electrode on the back surface of the wiring board. Further, a plurality of the connecting portions are bonded to the power supply electrode of the first semiconductor chip and the power supply electrode on the back surface of the wiring board.

DETAILED DESCRIPTION OF THE PREFERRED EMBODIMENTS

Figure 1:
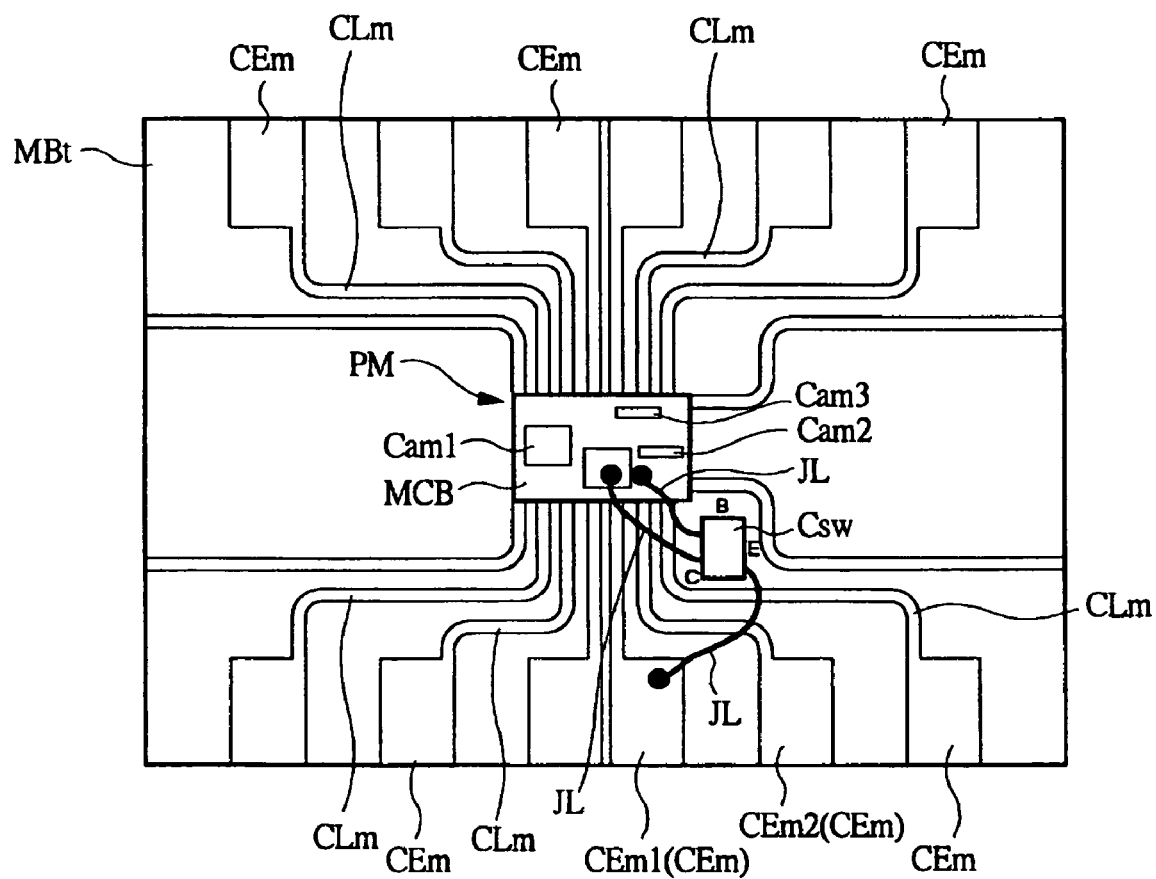
FIG. 1 is a diagram used in an electrical characteristic evaluation of a semiconductor device, which was considered by the present inventors.

Prior to a detailed description of exemplary embodiments of the present invention, the meaning of terms employed in the description of the embodiments will be explained as follows:

1. GSM (Global System for Mobile Communication) indicates one wireless communication system or standard used in a digital cellular phone. GSM includes three frequency bands of a radio wave to be used: the 900 MHz band called "GSM900" or simply "GSM", the 1800 MHz band called "GSM1800 or DCS (Digital Cellular System)1800 or PCN", and the 1900 MHz band called "GSM1900 or DCS1900 or PCS (Personal Communication Services). Incidentally, GSM1900 has been principally used in North America. In addition, GSM850 corresponding to an 850 MHz band might be used in North America.

2. A GMSK (Gaussian filtered Minimum Shift Keying) modulation system or scheme is a system used in the communication of audible or voice signals, i.e., a system that phase-shifts the phase of a carrier according to transmit data.

3. An EDGE (Enhanced Data GSM Environment) modulation system or scheme is a system used in data communications, i.e., a system in which an amplitude shift is further added to a phase shift of GMSK modulation.

Whenever circumstances require it for convenience in the following description of the embodiments, they will be described by being divided into a plurality of sections or embodiments. However, unless otherwise specified in particular, they are not irrelevant to one another. One thereof has to do with modifications, details and supplementary explanations of some or all of the other. When reference is made to a number of elements or the like (including the number of pieces, numerical values, quantity, range, etc.) in the following description of the embodiments, the number thereof is not limited to a specific number and may be greater than or less than or equal to the specific number, unless otherwise specified in particular and definitely limited to the specific number in principle. It is also needless to say that components (including an element or process steps, etc.) employed in the following description of the embodiments are not always essential, unless otherwise specified in particular and considered to be definitely essential in principle. Similarly, when reference is made to the shapes, positional relations and the like of the components or the like in the following description of the embodiments, they will include ones substantially analogous or similar to their shapes or the like, unless otherwise specified in particular and considered not to be definitely so in principle, etc. This is similarly applied even to the above-described numerical values and range.

Those elements each having the same function in all the drawings are respectively identified by the same reference numerals, and a repetitive description thereof will be omitted. In the drawings, some hatching might be provided to make it easy to read the drawings even in the case of plan views.

In the present embodiments, a MOS·FET (Metal Oxide Semiconductor Field Effect Transistor) corresponding to a representative example of a field effect transistor is abbreviated as "MOS", a p channel type MOS is abbreviated as "pMOS" and an n channel type MOS is abbreviated as "nMOS", respectively. Also, a bipolar transistor is abbreviated as "Bip". In the present embodiments, wirings, electrodes and via holes are described in parts for convenience. However, the electrodes and via holes will also be included as a wiring's lower conception.

Preferred embodiments of the present invention will be described in detail hereinafter with reference to the accompanying drawings.

Embodiment 1

A RF (Radio Frequency) power module (hereinafter simply called a "power module"), which was considered by the present inventors is, for example, of the type used in a digital cellular phone that transmit information though the use of a network of a GSM system. The power module includes an amplifier or amplifier circuit for signal amplification and a power supply control circuit, which supplies a desired power supply voltage to the amplifier circuit. A switching element of the power supply control circuit performs switching between the supply of the desired power supply voltage to the amplifier circuit and its non-supply. The switching element comprises, for example, a Bip or MOS. A circuit part of the power supply control circuit is provided in parts of the plural semiconductor chips, whereas the switching element is formed in a semiconductor chip different from each of these semiconductor chips (hereinafter called "amplifying chips") each formed with an amplifier circuit. It is packaged independently from the amplifying chips and is mounted on a printed wiring board equipped with the power module.

Meanwhile, the present inventors have found that, as a result of the fact that, since the a semiconductor chip (hereinafter called "switch chip") formed with the switching element is actually mounted on a module board equipped with the amplifying chips to reduce constituent elements or components of the digital cellular phone, thereby promoting scale-down of the digital cellular phone, a problem arises in that a resistance noticeably exists in a wiring path electrically connected to the power supply electrodes (emitter and collector electrodes) of the switching element. It turned out that the power supply voltage could not be sufficiently supplied to each amplifying chip at the beginning of development of the power module provided with the switch chip on the module board. It has been found that the cause of this problem is directed to the resistances of wirings connected with the emitter and collector electrodes of the switch chip, of the wirings of the module board. The present inventors have found that a problem has resided in the wiring structure of the module board as a result of a further analysis of the cause of the problem.

The module board considered by the present inventors has the following structure, for example. That is, the emitter electrode of the switch chip is connected to a corresponding internal-layer wiring of the module board through one via hole. Further, the internal-layer wiring is electrically connected to a corresponding back electrode of the module board via one via hole. Moreover, the collector electrode of the switch chip is electrically connected to a corresponding back electrode of the module board via one via hole. Thus, it has been proved as the cause of the problem that, since a module board free of recognition of a problem about the above wiring resistance need not reinforce the wirings for connecting the emitter and collector electrodes of the switch chip and the back electrode of the module board, and the emitter and collector electrodes of the switch chip and the back electrode of the module board may be exclusively electrically connected to one another, sufficient considerations have not been given to the wirings for connecting the emitter and collector electrodes of the switch chip and the back electrode of the module board in the case of the placement of only one via hole, as described above, as a result of the fact that priority is assigned to a possible reduction in the occupied area of each wiring in terms of a size reduction. The reason why the problem of the above wiring resistance does not come to the surface at an evaluation stage is assumed to be due to the fact that, upon electrical characteristic evaluation of the power module, the wirings in the module board are not built in the corresponding circuit to be evaluated, because each switching element is externally provided, and so the resistance of each wiring in the module board does not appear in the result of evaluation.

FIG. 1 is a view which will be used for describing an electrical characteristic evaluation of a power module PM. The power module PM intended for the electrical characteristic evaluation is mounted on the center of a main surface of a mother board MBt in a state in which its back surface is opposite to the main surface of the mother board MBt. Electrodes on the back surface of the power module PM are electrically connected to wirings CLm on the main surface of the mother board MBt and are electrically connected to electrodes CEm placed in the vicinity of the outer periphery of the mother board MBt through the wirings CLm. Of the electrodes CEm, the electrode CEm1 is an electrode for a power supply voltage (first voltage) Vdd, and the electrode CEm2 is an electrode for a power supply voltage (second voltage) Vcc. The amplifying chips (second semiconductor chips) Cam1, Cam2 and Cam3 are mounted on a main surface of a module board MCB of the power module PM. On the other hand, the switch chip (first semiconductor chip) Csw is not mounted on the module board MCB, but is externally provided. A switching element of the switch chip Csw comprises, for example, a pnp type Bip. An emitter electrode E of the Bip is electrically connected to its corresponding electrode CEm1 of the mother board MBt through a jumper line JL, whereas a collector electrode C and a base electrode B of the Bip are electrically connected to their corresponding wirings of the module board MCB through further jumper lines JL.

Figure 2:
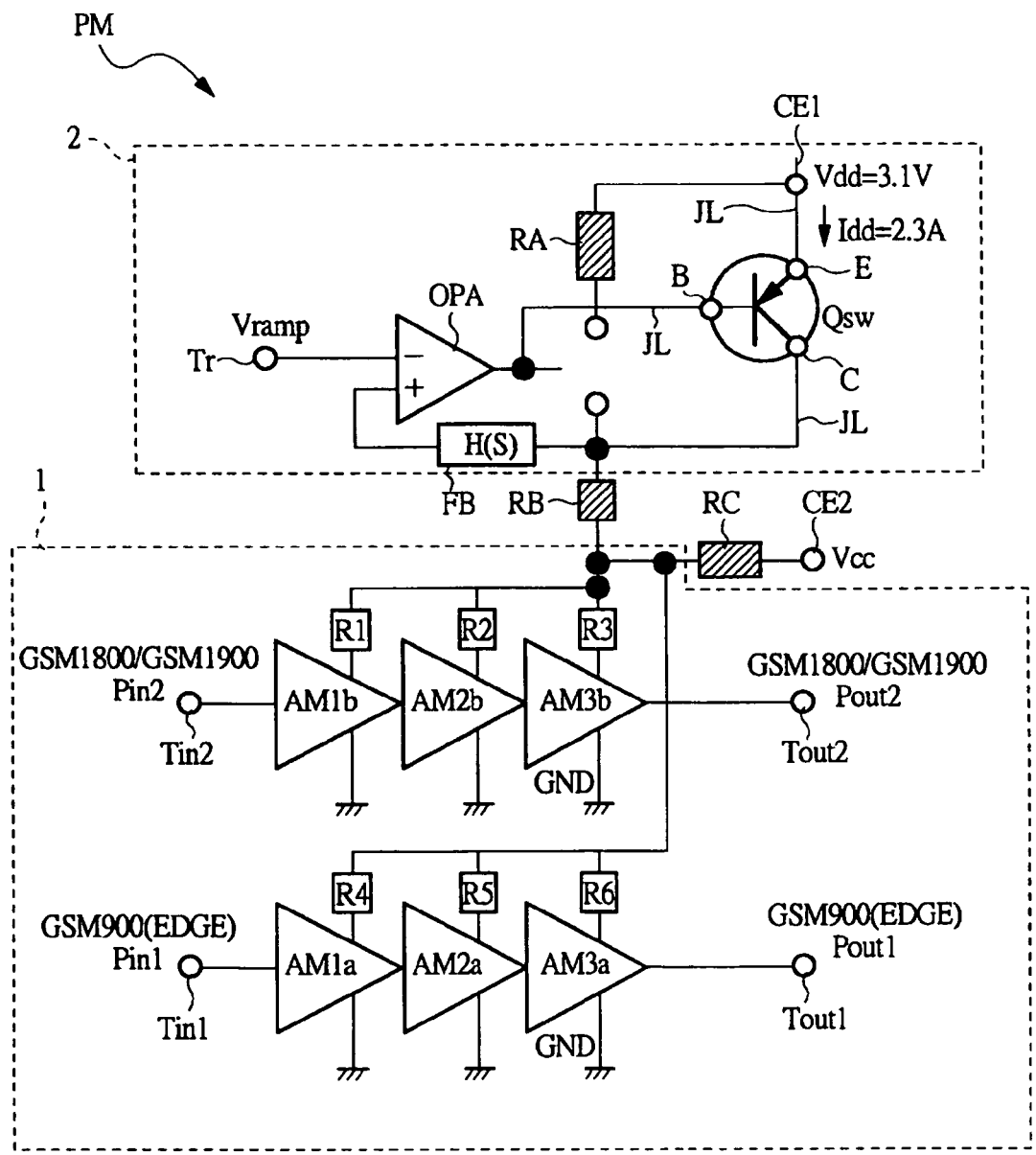
FIG. 2 is an equivalent circuit diagram of the semiconductor device shown in FIG. 1.

FIG. 2 shows an equivalent circuit of the power module PM of FIG. 1 at the time of electrical characteristic evaluation. Here, an equivalent circuit of a power module PM, which is adaptable to a triple band available to three frequencies of GSM900, GSM1800 and GSM1900, and which is capable of using a GMSK modulation system and en EDGE modulation system.

The power module PM includes a high-frequency power amplifier circuit (the above amplifier circuit) 1 and an operating voltage control circuit (the power supply control circuit) 2. The high-frequency power amplifier circuit 1 includes three-stage series-connected amplifier circuit parts AM1$a$, AM2$a$ and AM3$a$, Which amplify a signal of GSM900 (EDGE modulation system), and three-stage series-connected amplifier circuit parts AM1$b$, AM2$b$ and AM3$b$, which amplify signals of GSM1800 and GSM1900. Symbols R1 through R5 indicate resistors, Pin1 indicates a phase information input signal of GSM900, Tin1 indicates an input terminal of the amplifying circuit parts AM1$a$, AM2$a$ and AM3$a$, Pin2 indicates a phase information input signal of GSM1800/GSM1900, Tin2 indicates an input terminal of the amplifying circuit parts AM1$b$, AM2$b$ and AM3$b$ of GSM1800/GSM1900, Pout1 indicates a phase information output signal of GSM900, Tout1 indicates an output terminal of the amplifying circuit parts AM1$a$, AM2$a$ and AM3$a$ of GSM900, Pout2 indicates a phase information output signal of GSM1800/GSM1900, Tout2 indicates an output terminal of the amplifying circuit parts AM1$b$, AM2$b$ and AM3$b$ of GSM1800/GSM1900, and GND indicates a reference potential (ground potential, e.g., 0 (zero)V), respectively.

The operating voltage control circuit 2 includes an operational amplifier OPA, a feedback circuit FB and a BipQsw. An input voltage Vramp is inputted to an inversion input terminal Tr of the operational amplifier OPA. The output of the operational amplifier OPA is electrically connected to a corresponding base electrode B of the BipQsw. The BipQsw is a switching element of the switch chip. The power supply voltage Vdd is supplied to an emitter electrode E of the BipQsw. The power supply voltage Vdd is a voltage supplied from a battery, such as like a lithium battery or the like, of a digital cellular phone. Upon the evaluation of electrical characteristics, the power supply voltage is evaluated as, for example, about 3.1V in consideration of the battery drain or the like. An emitter current Idd is about 2.3A, for example. A power supply voltage Vcc is outputted to a collector electrode C of the BipQsW, based on an output signal produced from the operational amplifier OPA. The power supply voltage Vcc is supplied to the amplifying circuit parts AM1$a$, AM2$a$, AM3$a$, AM1$b$, AM2$b$ and AM3$b$ of the high-frequency power amplifier circuit 1. The feedback circuit FB is electrically connected between the collector electrode C and a non-inversion input terminal of the operational amplifier OPA. The feedback circuit FB is a circuit which feeds back the power supply voltage Vcc from the collector electrode C of the BipQsw to the non-inversion input terminal of the operational amplifier OPA. The feedback circuit FB comprises, for example, a CR circuit having a capacitor and a resistor. With the feedback of the power supply voltage Vcc to the non-inversion input terminal of the operational amplifier OPA via the feedback circuit FB, the operating voltage control circuit 2 is capable of automatically controlling the power supply voltage Vcc corresponding to its output in such a manner that the power supply voltage Vcc varies substantially linearly with respect to an input voltage (signal LDO or output level designation signal VOL). A wiring resistor RA is representative of the resistance of a wiring of the module board MCB to which the emitter electrode E of the BipQsw is connected, where the switch chip is mounted to the module board MCB (see FIG. 1). A wiring resistor RB is representative of the resistance of a wiring of the module board MCB to which the collector electrode C of the BipQsw is connected, where the switch chip is mounted to the module board MCB. The wiring resistors RA and RB are respectively determined depending on the lengths and number of wiring paths (wirings and viaholes) of the module board MCB. Further, a wiring resistor RC is representative of the resistances of the electrode CEm2 of the mother board MBt and the wiring CLm connected thereto.

Meanwhile, according to the electrical characteristic evaluation, no current flows in a wiring portion that forms the wiring resistor RA in the module board MCB, because the switching element (BipQsw) is externally provided during the electrical characteristic evaluation. That is, since the wiring resistor RA of the module board MCB is not built in the circuit to be evaluated, it does not appear in the result of evaluation. On the other hand, the present inventors have found that since the current flows into the wiring portion forming the wiring resistor RA in the module board MCB where the switch chip Csw is mounted on the module board MCB equipped with the amplifying chips Cam1, Cam2 and Cam3, a series resistance (wiring resistor RA+wiring resistor RB) of the power supply voltages Vdd and Vcc becomes manifest. Further, the present inventors have discovered the occurrence of the following problems, since no sufficient consideration has been given to the loss of each internal-layer resistance of the module board MCB. That is, a problem arises when the power supply voltage Vdd supplied to the switch chip Csw is lowered due to the consumption of the battery of the digital cellular phone, a voltage drop is developed across the wiring path (i.e., each of the wiring resistors RA and RB) in the module board MCB, which is electrically connected to the BipQsw, whereby the output of the power module PM cannot be obtained sufficiently, thus causing a situation in which a radio wave cannot reach a base station due to insufficient transmission power of the cellular phone.

Therefore, the present embodiment 1 will provide one example of a specific means for solving the problems referred to above. The present embodiment 1 will provide, for example, a power module having a signal amplifying function of a digital cellular phone which transmits information through the use of a network of a GSM system and which is a triple band device available to the three frequency bands of GSM900, GSM1800 and GSM1900 and which is capable of using both a GMSK modulation system and an EDGE modulation system.

Figure 3:
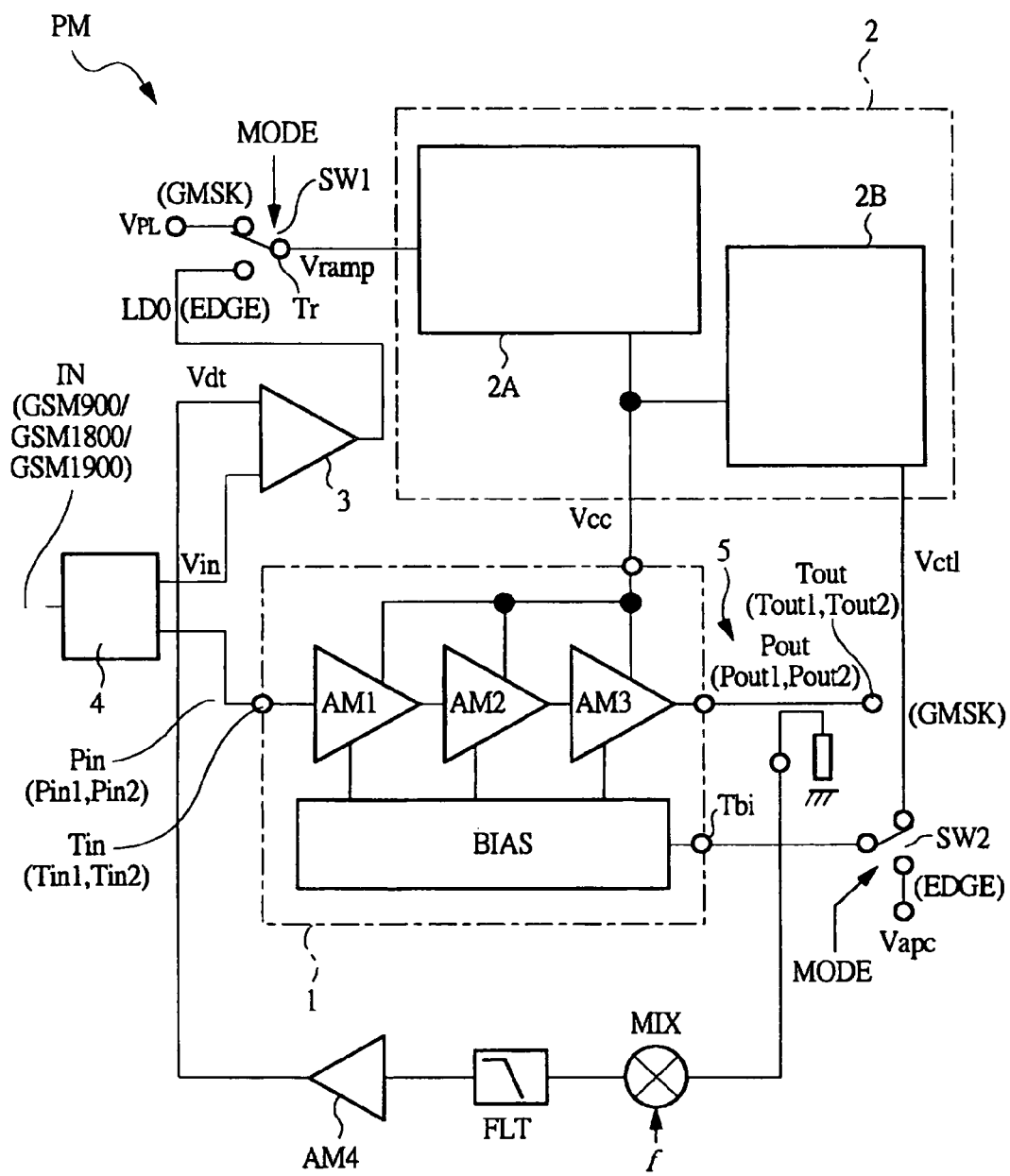
FIG. 3 is a fragmentary circuit diagram showing one example of a semiconductor device representing one embodiment of the present invention.

FIG. 3 shows one example of the power module PM according to the present embodiment 1. The power module PM includes a high-frequency power amplifier circuit 1, and an operating voltage control circuit 2. The high-frequency power amplifier circuit 1 includes, for example, three-stage amplifier circuit parts (power amplifiers) AM1, AM2 and AM3, and a bias circuit BIAS, which applies a bias voltage to these amplifier circuit parts AM1, AM2 and AM3. Incidentally, FIG. 3 collectively shows the amplifier circuit parts AM1a, AM2a, AM3a, AM1b, AM2b and AM3b for amplifying the signals lying in the respective frequency bands of GSM900, GSM1800 and GSM1900 shown in FIG. 2 as the amplifier circuit parts AM1 through AM3 in order to make it easy to understand the drawing.

The operating voltage control circuit 2 is a circuit for generating a voltage to be applied to the high-frequency power amplifier circuit 1, and it includes a power supply control circuit 2A and a bias voltage generating circuit 2B. The power supply control circuit 2A is a circuit (power supply voltage Vcc-controlled circuit) which generates a power supply voltage Vcc and applies it to drain terminals of respective output power MOSs of the amplifier circuit parts AM1, AM2 and AM3 to thereby control the values of the outputs of the amplifier circuit parts AM1, AM2 and AM3. The bias voltage generating circuit 2B is a circuit which generates a control voltage Vct1 for controlling the bias circuit BIAS. In the present embodiment 1, when the power supply control circuit 2A generates the power supply voltage Vcc, based on an output level designation signal VPL supplied from a baseband circuit, the bias voltage generating circuit 2B generates the control voltage Vct1 on the basis of the power supply voltage Vcc generated by the power supply control circuit 2A. The baseband circuit is a circuit which generates the output level designation signal VPL. The output level designation signal VPL is a signal for designating or specifying the output level of the high-frequency power amplifier circuit 1. This signal is generated based on the distance between a cellular phone and its corresponding base station, i.e., an output level corresponding to the intensity of a radio wave.

In the present embodiment 1, there is provided a selector switch SW1 for selecting either the GMSK modulation system or the EDGE modulation system to enable both communications of the GMSK modulation system and the EDGE modulation system. The selector switch SW1 is provided in a modulation/demodulator circuit. Switching to the modulation system by the selector switch SW1 is performed by a mode signal MODE for specifying the modulation system. When the GMSK modulation scheme is used, the output level designation signal VPL is inputted to the power supply control circuit 2A by the selector switch SW1. On the other hand, when the EDGE modulation scheme is used, a signal LDO is inputted to the power supply control circuit 2A by the selector switch SW1 in place of the output level designation signal VPL. The signal LDO is a signal equivalent to amplitude information about transmit data and is transmitted from a comparator 3. The comparator 3 compares an amplitude information signal Vin outputted from a phase amplitude separation circuit 4 provided on the input side of the high-frequency power amplifier circuit 1, with a detect signal Vdt outputted from an output level detecting coupler 5 provided on the output side of the high-frequency power amplifier circuit 1, thereby outputting a signal corresponding to the difference in potential therebetween. The phase amplitude separation circuit 4 separates a transmit signal IN into a phase information signal Pin and the amplitude information signal Vin. Owing to such a configuration, such feedback control as to allow the output level of the high-frequency power amplifier circuit 1 to coincide with the level of the amplitude information signal Vin is carried out. Incidentally, the output of the coupler 5 is frequency-converted by a mixer MIX, which in turn is transmitted via a filter FLT and an amplifier circuit part AM4 to the comparator 3 as the detect signal Vdt.

Since no output level designation signal VPL is inputted to the power supply control circuit 2A in the EDGE modulation mode, the bias voltage generating circuit 2B is not able to generate the control voltage Vct1 corresponding to the output level, based on the power supply voltage Vcc supplied from the power supply control circuit 2A. Therefore, there is provided a selector switch SW2 which supplies an output level control voltage Vapc supplied from the baseband circuit or the modulator/demodulator circuit to the bias circuit BIAS in place of the voltage supplied from the bias voltage generating circuit 2B. Switching to the modulation scheme by the selector switch SW2 is carried out by the mode signal MODE. Incidentally, symbol Tin indicates an input terminal for the amplifier circuit parts AM1 through AM3, symbol Tout indicates an output terminal for the amplifier circuit parts AM1 through AM3, and symbol Tbi indicates an input terminal for the bias circuit BIAS, respectively.

Figure 4:
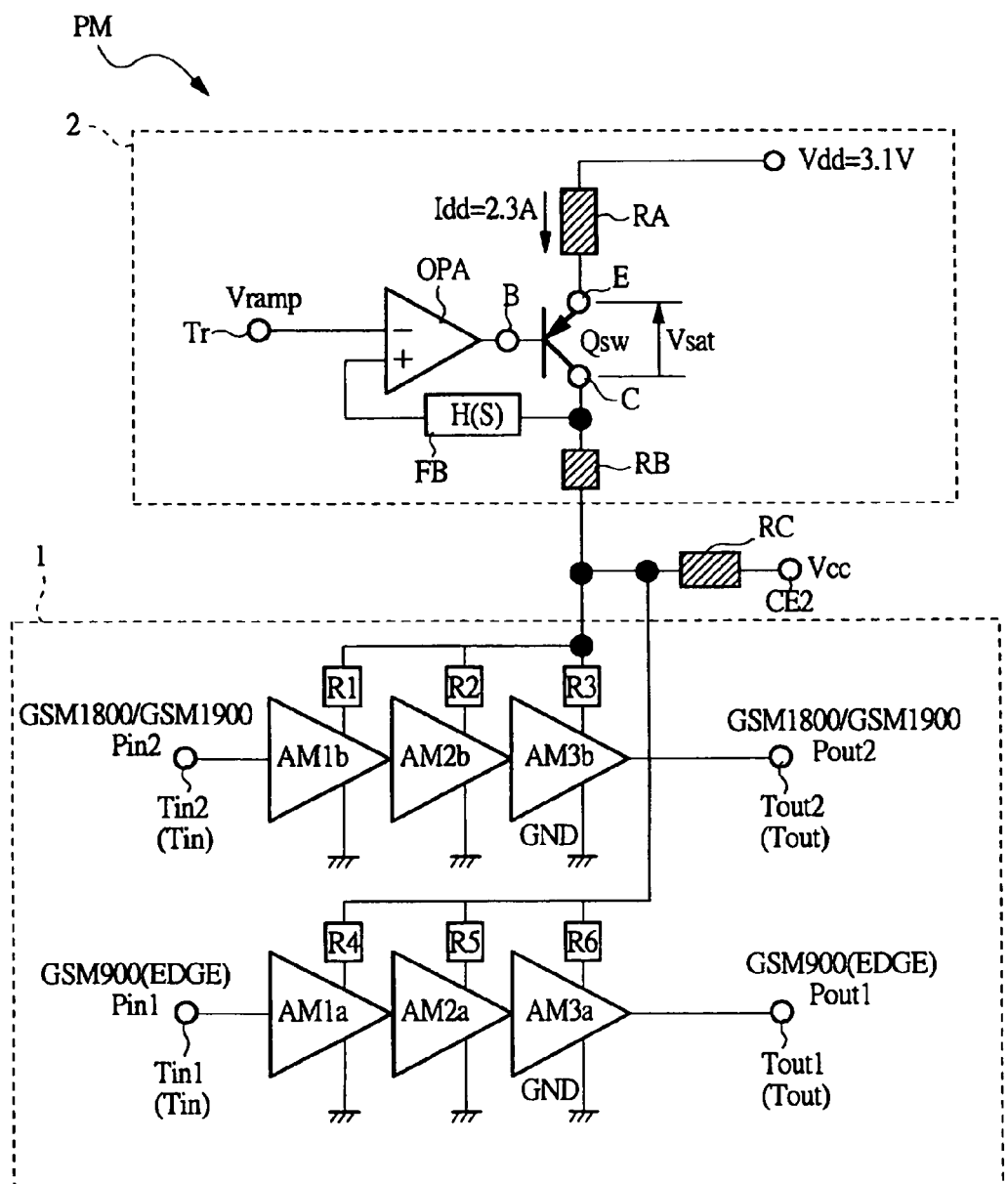
FIG. 4 is an equivalent circuit diagram illustrating a part of the semiconductor device shown in FIG. 3.

FIG. 4 is an equivalent circuit diagram of the high-frequency power amplifier circuit 1 and the power supply control circuit 2A. A switch chip (BipQsw) is identical to FIG. 2 except that it is mounted on the module board. With the turning on/off of the BipQsw, a phase information output signal of the high-frequency power amplifier circuit 1 can be controlled. The switching element may use a PMOS in place of the BipQsw. In this case, a source electrode of the pMOS is equivalent to the emitter electrode of the BipQsw, whereas a drain electrode of the pMOS is equivalent to the collector electrode of the BipQsw.

The power supply voltage Vdd is about 3.5V, for example, in the normal state, even if the switching element is Bip or MOS. In the present embodiment 1, however, the output level of the power module PM can be maintained at a predetermined value, as will be described later, even if the power supply voltage Vdd reaches about 3.1V due to, for example, the consumption of the battery power or the like. An emitter current Idd is about 2.3A, for example. Since the emitter current is large, the loss of an output voltage due to a voltage drop developed across a wiring resistor RA is large. Vsat indicates an emitter-to-collector voltage of the BipQsw and is about 52 mV, for example.

Figure 5:
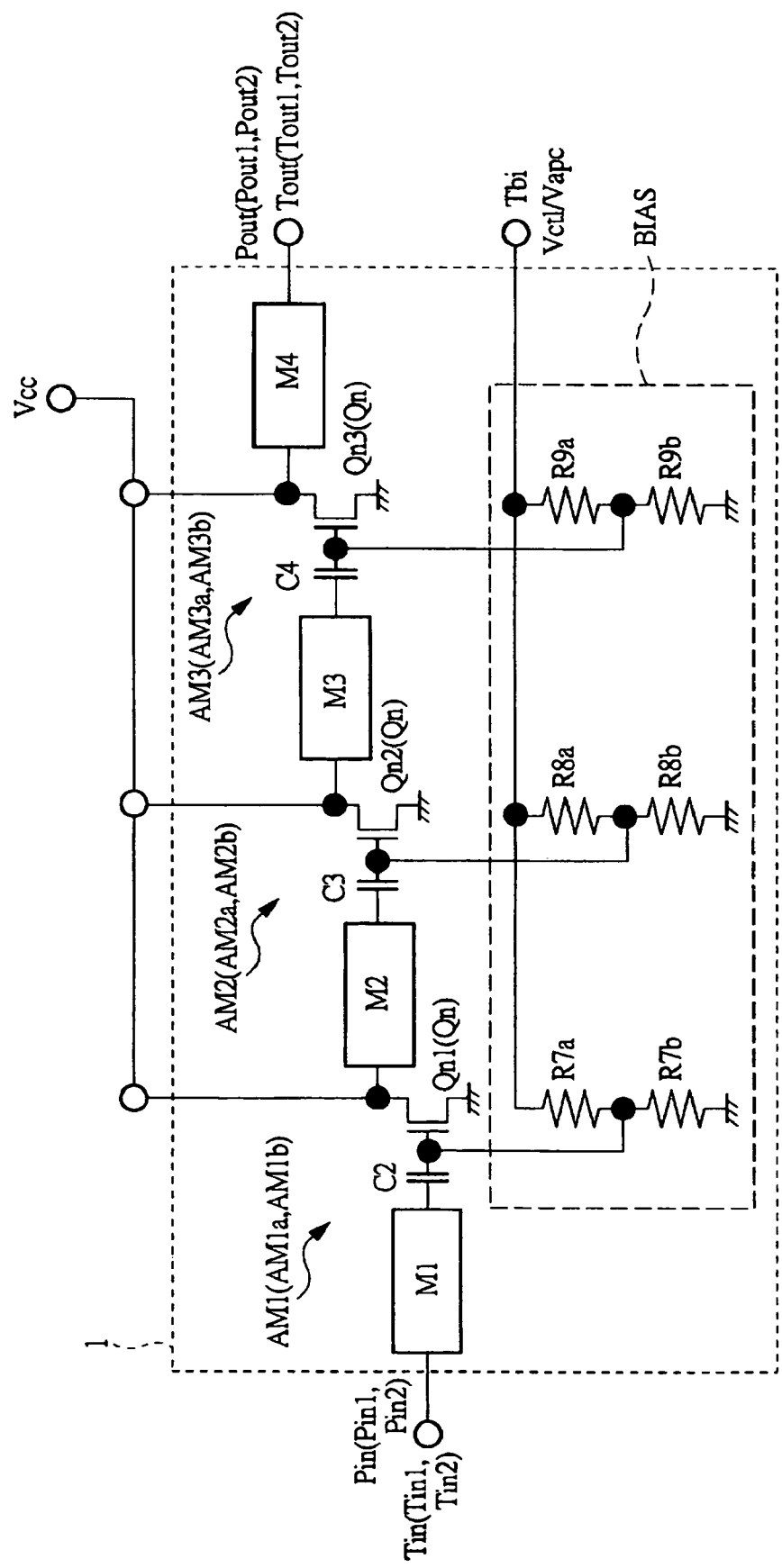
FIG. 5 is a circuit diagram showing one example of part of the semiconductor device shown in FIGS. 3 and 4.

FIG. 5 shows one example of a circuit diagram showing the high-frequency power amplifier circuit shown in FIGS. 3 and 4. The high-frequency power amplifier circuit 1 according to the present embodiment 1 has a circuit configuration in which a plurality of nMOSQn (Qn1, Qn2 and Qn3) are sequentially connected in tandem as active elements. That is, the high-frequency power amplifier circuit 1 has a three-stage configuration wherein an input terminal Tin of the high-frequency power amplifier circuit 1 is connected to a gate electrode of the first-stage nMOSQn1 through a matching circuit M1 and a capacitor C2, a drain electrode of the first-stage nMOSQn1 is connected to a gate electrode of the middle-stage nMOSQn2 via a matching circuit M2 and a capacitor C3, a drain electrode of the middle-stage nMOSQn2 is connected to a gate electrode of the final-stage nMOSQn3 via a matching circuit M3 and a capacitor C4, and further a drain electrode of the final-stage nMOSQn3 is connected to an output terminal Tout via a matching circuit M4. The nMOSQn1 is equivalent to the amplifier circuit part AM1 (AM1a, AM1b), the nMOSQn2 is equivalent to the amplifier circuit part AM2 (AM2a, AM2b), and the nMOSQn3 is equivalent to the amplifier circuit part AM3 (AM3a, AM3b). An output level of the high-frequency power amplifier circuit 1 is controlled by the bias circuit BIAS and the power supply voltage Vcc supplied from the power supply control circuit 2A. Here, the power supply voltage Vcc is supplied to the respective drain electrodes of the three nMOSQn1, nMOSQn2 and nMOSQn3. The matching circuits M1 through M4 are microstrip lines which serve as inductance elements for impedance-matching between the respective stages. Further, the capacitors C2 through C4, that are connected in series with the matching circuits M1 through M3, respectively, have the function of cutting off dc voltages of the power supply voltage Vcc and gate bias voltages.

The bias circuit BIAS has a plurality of resistors R7a, R7b, R8a, R8b, R9a and R9b. The resistors R7a and R7b are connected in series between a wiring connected to an input terminal Tbi of the bias circuit BIAS and a reference potential (e.g., ground potential: 0V). A wiring portion for connecting between the resistors R7a and R7b, and the gate electrode of the nMOSQn1 are electrically connected to each other. Similarly, the resistors R8a and R8b are connected in series between the wiring connected to the input terminal Tbi of the bias circuit BIAS and the reference potential. A wiring portion for connecting between the resistors R8a and R8b, and the gate electrode of the nMOSQn2 are electrically connected to each other. Similarly, the resistors R9a and R9b are connected in series between the wiring connected to the input terminal Tbi of the bias circuit BIAS and the reference potential. A wiring portion connecting the resistors R9a and R9b and the gate electrode of the nMOSQn3 are electrically connected to each other. The present circuit is configured in such a manner that, when the control voltage Vctl or the output level control voltage Vapc is inputted to the input terminal Tbi of the bias circuit BIAS, the voltage is divided by the resistors R7a and R7b, R8a and R8b, and R9a and R9b, respectively, so that desired bias voltages are developed, and the gate bias voltages are respectively inputted to the gate electrodes of the nMOSQn1, nMOSQn2 and nMOSQn3. As a modification of the bias circuit BIAS, for example, a bias circuit may be used which includes a circuit that generates a temperature-compensated bias voltage or a circuit that corrects a shift in bias voltage due to a device's variations, and the like.

Although not limited in particular, the first-stage and middle-stage nMOSQn1 and nMOSQn2 and the resistors R7a, R7b, R8a, R8b, R9a and R9b of the bias circuit BIAS are formed in one amplifying chip, and the final-stage nMOSQn3 is formed in another amplifying chip. The capacitors C1 through C4 and the like are formed independently from the two amplifying chips as chip parts. The two amplifying chips and the chip parts are mounted on the common module board to form the power module PM.

Figure 6:
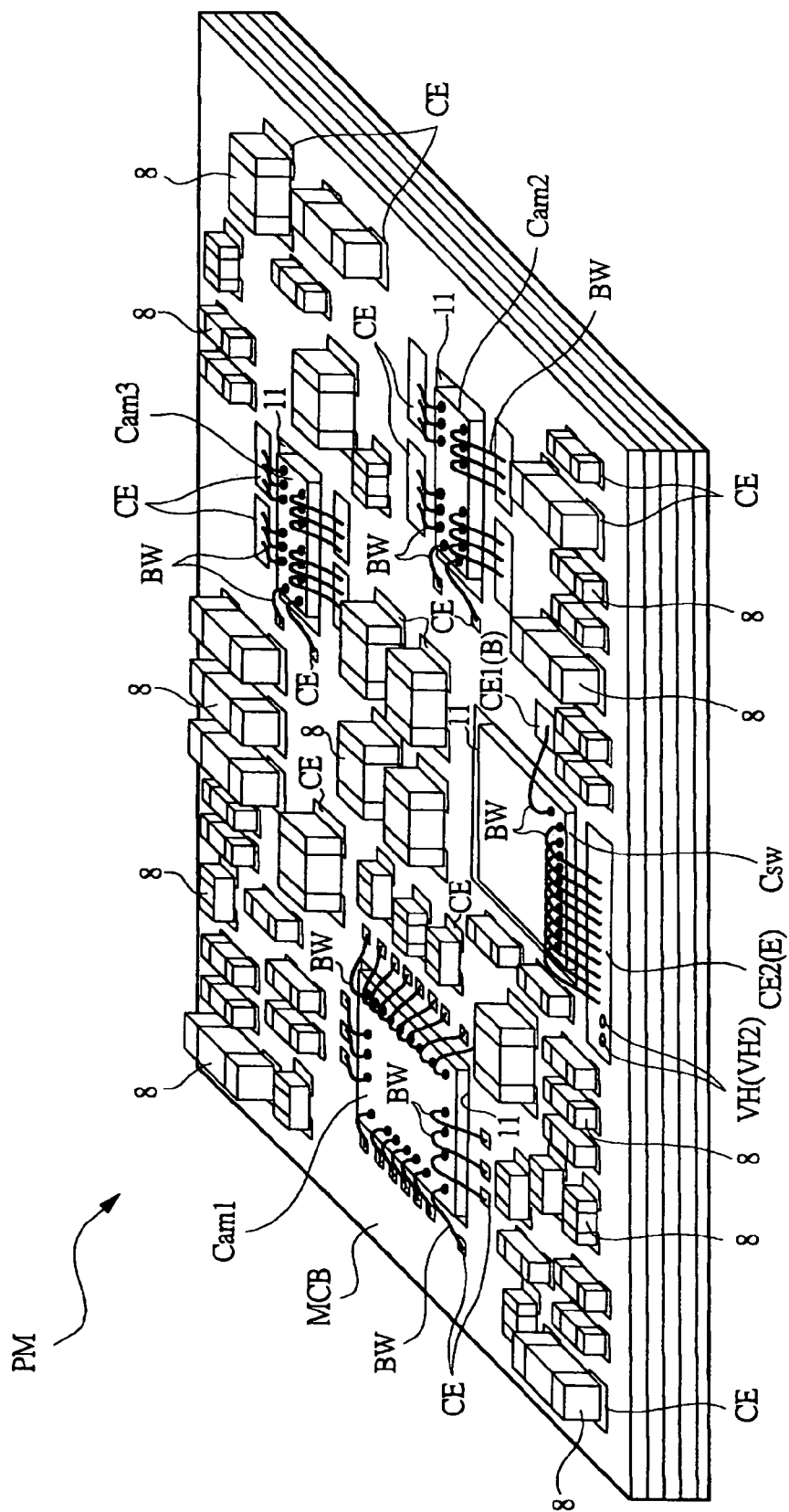
FIG. 6 is a perspective view illustrating an example of a device structure of the semiconductor device according to one embodiment of the present invention.
Figure 7:
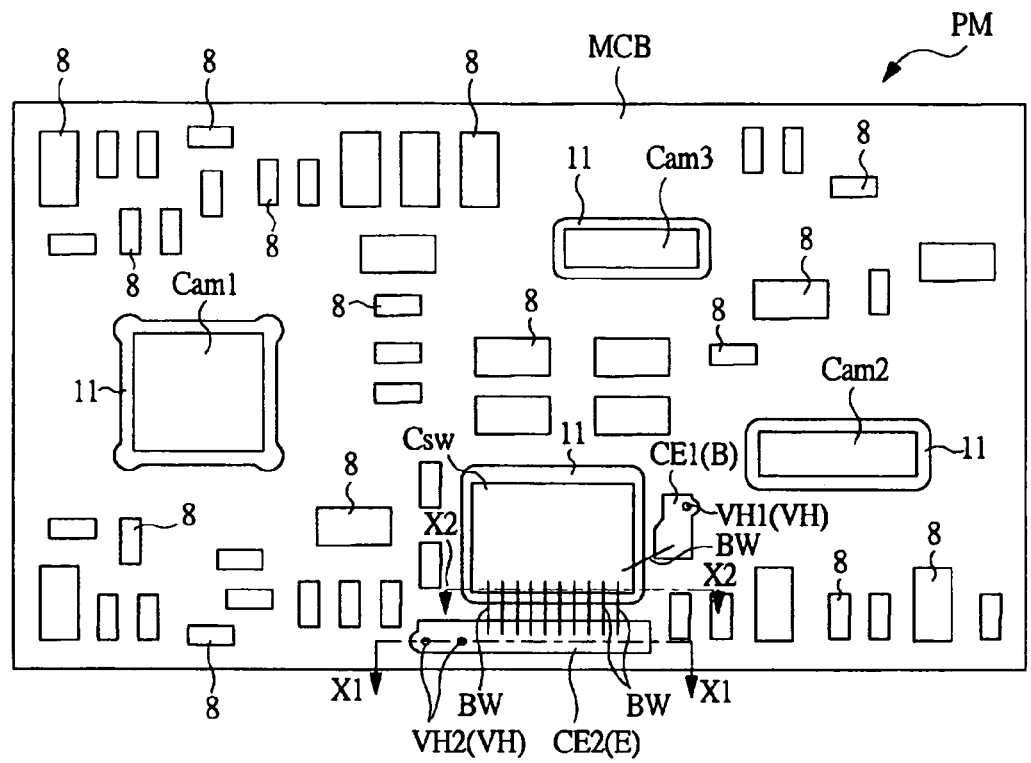
FIG. 7 is a plan view illustrating a main surface of the semiconductor device shown in FIG. 6.
Figure 8:
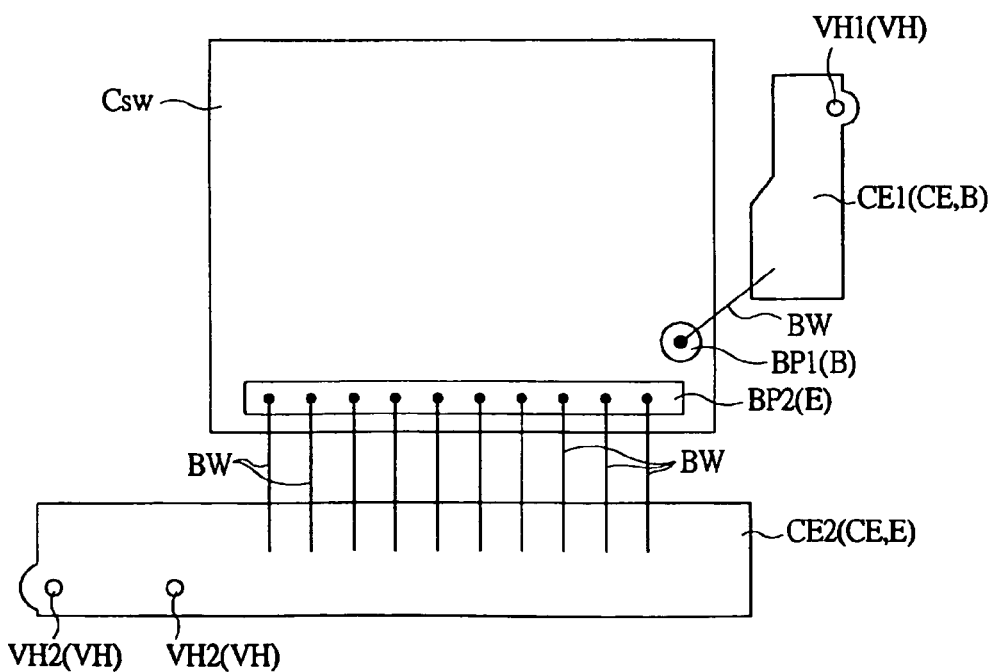
FIG. 8 is a fragmentary enlarged plan view depicting the semiconductor device shown in FIG. 7.
Figure 9:
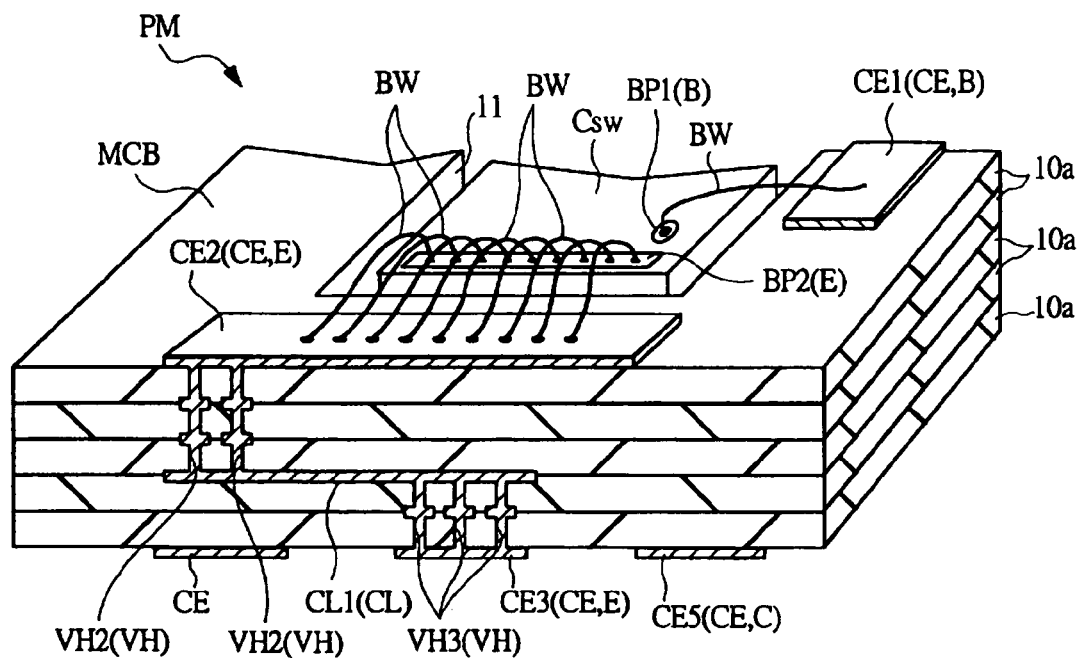
FIG. 9 is a partly broken-away perspective view showing the semiconductor device, which includes a section taken along line X1—X1 of FIG. 7.
Figure 10:
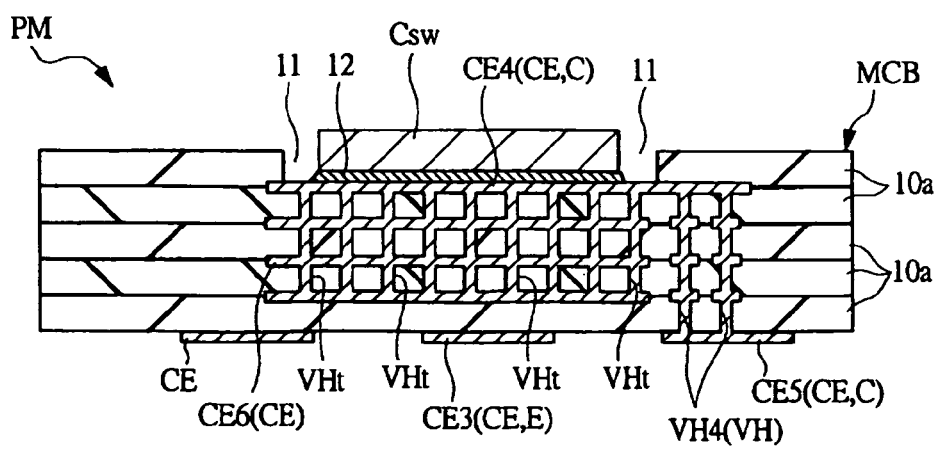
FIG. 10 is a cross-sectional view taken along line X2—X2 of FIG. 7.
Figure 11:
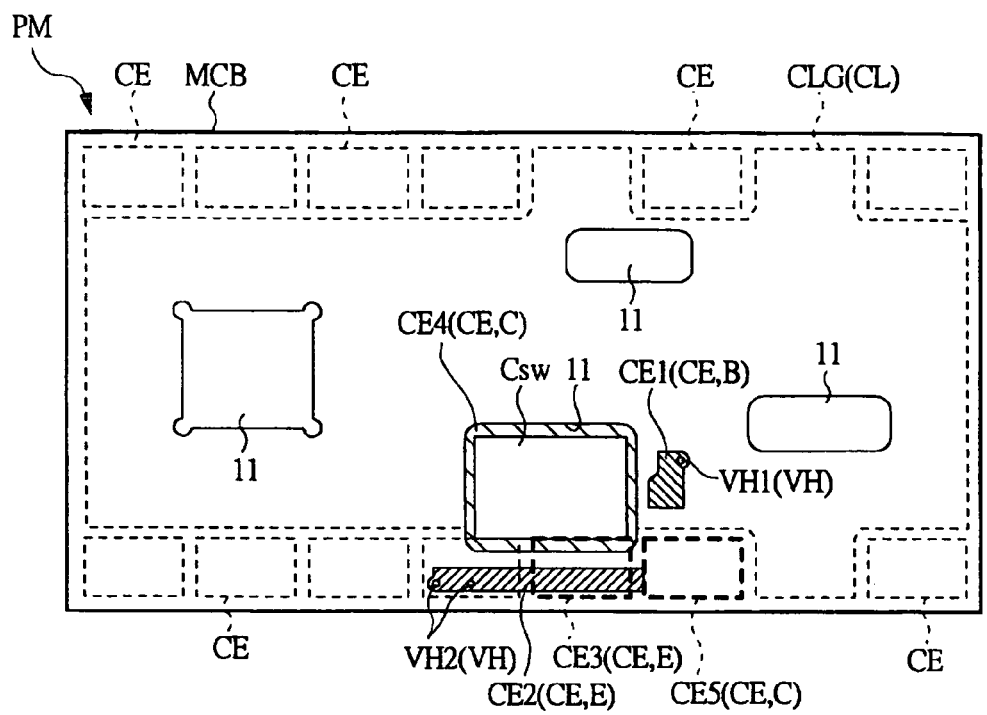
FIG. 11 is a plan view showing a first layer (main surface) of the semiconductor device shown in FIG. 6.
Figure 12:
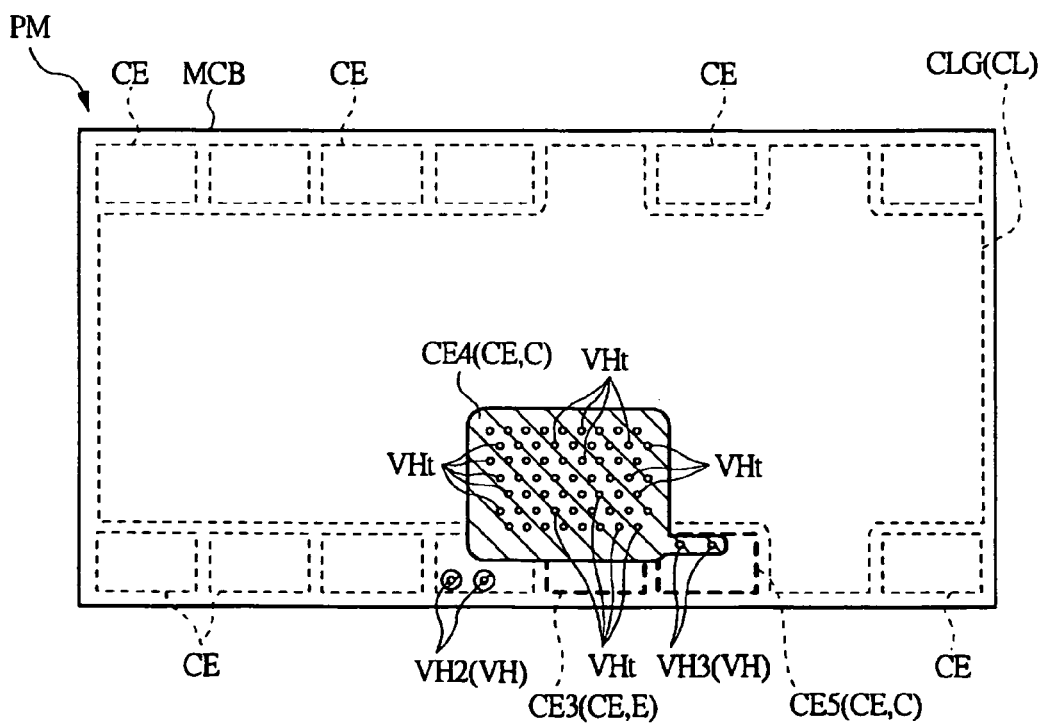
FIG. 12 is a plan view illustrating a second layer of the semiconductor device shown in FIG. 6.
Figure 13:
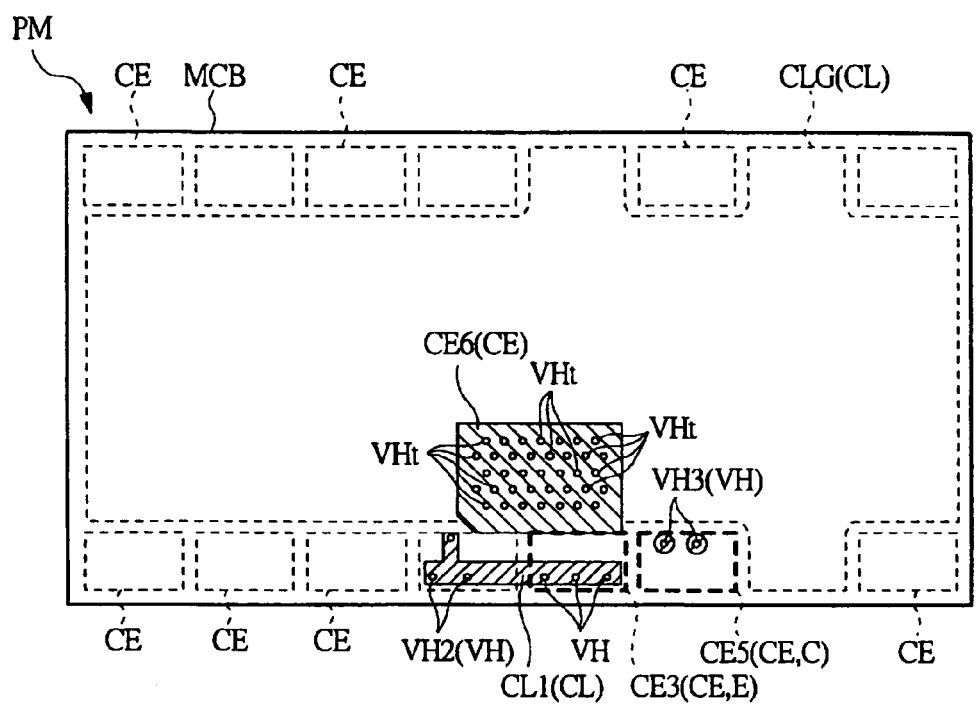
FIG. 13 is a plan view depicting a fourth layer of the semiconductor device shown in FIG. 6.
Figure 14:
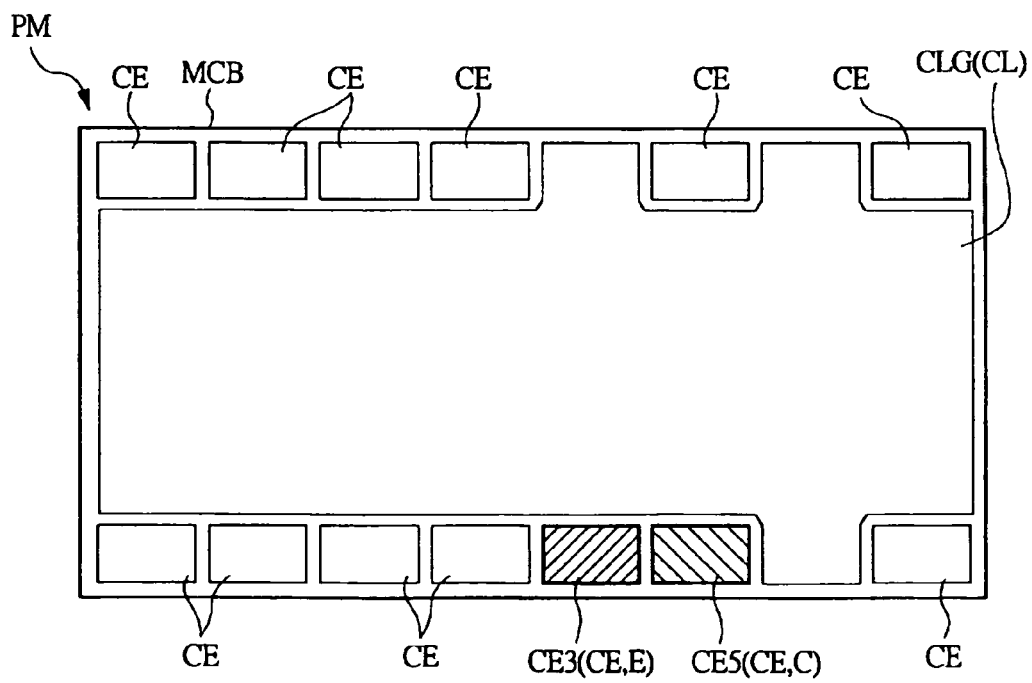
FIG. 14 is a plan view showing a sixth layer (back surface) of the semiconductor device shown in FIG. 6.

Next, FIG. 6 is a perspective view showing one example of a device structure of the power module PM according to the present embodiment 1; FIG. 7 is a plan view showing a main surface of the power module PM of FIG. 6; FIG. 8 is a fragmentary enlarged plan view of the power module PM of FIG. 7; FIG. 9 is a partly broken-away perspective view of the power module PM, which includes a cross-section taken along line X1—X1 of FIG. 7; FIG. 10 is a cross-sectional view taken along line X2—X2 of FIG. 7; and FIGS. 11 through 14, respectively, show plan views of a first layer (main surface), a second layer, a fourth layer and a sixth layer (back surface) of the power module PM, respectively. Incidentally, no encapsulating member is shown in FIGS. 6 through 15 to make it easy to understand the drawings.

The power module PM has a module board MCB, the amplifying chips Cam1, Cam2 and Cam3 mounted on its main surface, the switch chip Csw, and a plurality of chip parts 8.

The module board MCB will be explained first. The module board MCB has a multilayered wiring structure in which, for example, five insulator plates 10a are integrated into one by their lamination. The insulator plates 10a respectively comprise a ceramic, such as, for example, alumina (aluminum oxide: $Al_2O_3$ and dielectric constant=9 to 9.7) or the like, which is low in dielectric loss up to a milli-meter wave range. However, the insulator plates are not limited as such, but may be changed in various ways. For instance, a glass epoxy resin or the like may be used. Wirings CL and electrodes CE are formed on the front surfaces and back surfaces of the insulator plates 10a. The wiring CL and electrodes CE on the main surface (first layer, first surface) and the back surface (sixth layer, second surface) of the module board MCB comprise, for example, an alloy of copper (Cu) and tungsten (W). Their surfaces are given nickel (Ni) plating and gold (Au) plating in sequence. The gold plating has the function of preventing oxidation and corrosion of each wiring CL and each electrode CE. The wirings CL and the electrodes CE of the inner layers of the module board MCB, respectively, comprise, for example, an alloy of copper (Cu) and tungsten (W).

Of the wiring layers of the module board MCB, the wiring layers corresponding to the second layer, fourth layer and sixth layer (back surface) are principally provided as wiring layers of wirings CLG (CL) for supply of a reference potential (ground potential: 0V, for example in the present embodiment). The remaining wiring layers are principally provided as wiring layers of wirings CL for transmission paths. The reference potential supply wiring CLG is formed in a pattern that is wider than that of the wiring CL for the transmission path. Owing to the provision of the wiring layers for the supply of the reference potential among the different wiring layers for the transmission paths, interference between signals that flow in the different wiring layers can be suppressed or prevented. The width of each wiring CL of such a module board MCB and the thickness of each insulator plate 10a, and the like are suitably set such that the impedance of the transmission path reaches about 50 Ω, for example. The different wiring layers are electrically connected to one another through conductor films lying in via holes (connecting portions). The conductor film lying in each via hole comprises an alloy of copper (Cu) and tungsten (W), for example.

The chips Cam1, Cam2, Cam3 and Csw and the chip parts 8, and an essential part of the power module PM according to the present embodiment 1, will be explained next. The respective chips Cam1, Cam2, Cam3 and Csw are respectively mounted in a state in which their main surfaces (device forming surfaces) are turned up, so as to be well held within recesses 11 that are substantially rectangular in plan view, which are called "cavities", provided in the main surface of the module board MCB. Bonding pads (hereinafter called simply "pads") on the main surfaces of the chips Cam1, Cam2, Cam3 and Csw are electrically connected to their corresponding electrodes CE on the main surface of the module board MCB through bonding wires (hereinafter called simply "wires") BW. The wires BW are made of gold (Au), for example, and are bonded to areas free of placement of the via holes VH, of the electrodes CE on the main surface of the module board MCB. This is done to avoid the following defective conditions. That is, although fine depressions and projections are formed in the surfaces of via hole VH-disposed areas of electrode CE's patterns, defective conditions occur when the wires BW are bonded to the depressions and projections; for example, the strength of bonding of each wire BW becomes weak and the wires BW cannot be well bonded due to the depressions and projections. In other words, the bonding of the wires BW to the via hole VH-free areas of the electrodes CE makes it possible to improve the reliability of bonding between the wires BW and the electrodes CE.

The first-stage and middle-stage amplifier circuit parts AM1 (AM1a, AM1b) and AM2 (AM2a, AM2b) (i.e., the nMOSQn1 and nMOSQn2) for GSM900, GSM1800 and GSM1900, and elements like the resistors R7a, R7b, R8a, R8b, R9a, R9b, etc. for the bias circuit BIAS are formed in the relatively large amplifying chip Cam1. The final-stage amplifier circuit part AM3 (AM3a) (i.e., nMOSQn3) for GSM900 is formed in the relatively small chip Cam2. Also, the final-stage amplifier circuit part AM3 (AM3b) (i.e., nMOSQn3) for GSM1800 and GSM1900 is formed in the relatively small chip Cam3.

The switch BipQsw is formed in the chip Csw. Pads BP1 and BP2 are disposed on the main surface of the chip Csw (see FIGS. 8 and 9). The pad P1 is a portion for forming the base electrode B and formed in a pattern that is circular as seen in plan view. For instance, one end of one wire BW is bonded to the pad BP1. The other end of the wire BW is bonded to its corresponding area free of a via hole VH1 (VH), of an electrode CE1 (B, CE) on the main surface of the module board MCB. On the other hand, the pad BP2 is a portion (i.e., portion to which the power supply voltage Vdd is applied) for forming the emitter electrode E, and it is formed in a plane-zonary pattern that extends along the long side of the chip Csw. For instance, one of the ends of ten wires BW are bonded to the pad BP2. The other ends of the wires BW are bonded to an area free of via holes VH2 (VH), of an electrode (first electrode) CE2 (E, CE) on the main surface of the module board MCB.

Meanwhile, in the present embodiment 1, the electrode CE2, which is electrically connected to the emitter electrode E of the switch chip Csw, is electrically connected to its corresponding wiring CL1 (CL) of the fourth layer via, for example, two via holes VH2. The wiring CL1 is a wiring for changing a wiring path. The wiring CL1 is electrically connected to its corresponding electrode (third electrode) CE3 (CE, E) corresponding to the sixth layer (back surface of module board MCB) through, for example, three via holes VH3 respectively placed in plan positions different from the via holes VH2 (see FIG. 9). The electrode CE2 and the wiring CL1 are formed to be wider than the wiring CL for the normal transmission path. Further, the electrode CE3 for the power supply voltage Vdd on the back of the module board MCB is disposed directly below the pad BP2 of the chip Csw. The longitudinally-extending sizes (wiring path lengths) of the electrode CE2 and wiring CL1 are set so as to become shorter than the length equivalent to the three electrodes CE, preferably, two electrodes CE on the back surface of the module board MCB (see FIGS. 11 and 13). In the power module considered by the present inventors, there has been no recognition of the problem about each wiring resistance of the module board, as mentioned above. Therefore, the electrodes CE2 and CE3 and the wiring CL1 may simply electrically be connected and the via holes VH2 and VH3 for connecting them are also provided one alone. Further, the wiring CL1 is also formed to be more slender than the wiring CL1 in the present embodiment 1. Therefore, the wiring resistor RA will increase in resistance value. On the other hand, the present embodiment 1 is capable of reducing the resistance of the wiring resistor RA owing to the above configuration.

The back surface of the switch chip Csw serves as the collector electrode C (i.e., the electrode to which the power supply voltage Vcc is applied). The collector electrode C of the back surface of the chip Csw is bonded to its corresponding electrode (second electrode) CE4 of the main surface (second wiring layer) of the module board MCB by an adhesive agent 12, such as like solder or the like. The electrode CE4 is formed in a pattern that is substantially rectangular as seen in plan view, which is slightly larger than the size of the chip. In the present embodiment 1, the electrode CE4 of the second layer is electrically connected to its corresponding electrode (fourth electrode) CE5 (CE, C) of the sixth layer (back surface of the module board MCB) through, for example, two via holes VH4. The electrode CE5 for the power supply voltage Vcc is disposed so as to be adjacent to the electrode CE4 for the power supply voltage Vdd (see FIG. 10). In the power module considered by the present inventors, there has been no recognition of the problem about each wiring resistance of the module board, as mentioned above. Therefore, the electrodes CE4 and CE5 may be simply electrically connected, and the via hole VH4 for connecting the electrodes CE4 and CE5 is also provided one alone, thereby leading to an increase in the resistance of the wiring resistor RB. In contrast, in the present embodiment 1, the resistance of the wiring resistor RB also can be reduced owing to the above configuration. Thus, according to the present embodiment 1, the output characteristic of the power module PM can be improved, since the resistances of wiring resistors RA and RB can be reduced.

It should be understood that the number of via holes VH2 that electrically connect the electrode CE2 of the main surface of the module board MCB and the wiring CL1 of the internal layer of the module board MCB is not limited to two, but may be three or more, for example. If the number of the viaholes VH2 is increased, then the resistance of the wiring resistor RA can also preferably be reduced correspondingly. However, the electrode CE2 must be lengthened to increase the viaholes VH2. However, since the electrode CE2 is disposed on the main surface of the module board MCB, the electrode CE2 cannot be lengthened in an easy way, because other chip parts 8 and the electrodes CE used therefor are also disposed around the electrode CE2. If an attempt is made to lengthen the electrode CE2, then the size of the module board MCB is unavoidably increased. Therefore, the number of the via holes VH2 for electrically connecting the electrode CE2 and the wiring CL1 may preferably be two in the product considered by the present inventors, although it cannot be limited in particular because it changes according to the products. On the other hand, since the via holes VH3 for electrically connecting the wiring CL1 of the internal layer of the module board MCB and the electrode CE3 of the back surface of the module board MCB have slight allowances for their placement positions, the number of the via holes VH3 is made greater than the number of the via holes VH2 in order to make up for the fact that the number of the via holes VH2 is not so increased as mentioned above. Thus, a reduction in the wiring resistor RA is achieved. The number of the via holes VH3 for electrically connecting the wiring CL1 of the internal layer of the module board MCB and the electrode CE3 of the back surface of the module board MCB is not limited to three, but may be four or more, for example. However, it is preferable to avoid an increase in the plane size of the module board MCB in a manner similar to the above. If consideration is paid to such a viewpoint, then the number of the viaholes VH3 for electrically connecting the wiring CL1 and the electrode CE3 may preferably be three in the product considered by the present inventors, although it cannot be limited in particular because it changes according to the products.

Incidentally, the electrode CE4 is bonded to a plurality of via holes VHt each having a thermal radiation action, called "thermal vias". The electrode CE4 is electrically and physically bonded to its corresponding lower electrode CE6 through the via holes VHt. Thus, it is possible to radiate heat generated upon the operation of the chip Csw toward the outside.

As the chip parts 8, capacitive elements, diode elements, transistor elements, etc. for forming the matching circuits, a power switch circuit 6, etc. are formed. The chip parts 8 are bonded to their corresponding wirings on the main surface of the module board MCB by means of bonding materials and are electrically connected thereto. Incidentally, the capacitive elements can also be formed in the corresponding internal layers of the module board MCB through the use of conductor layers on the obverse and reverse sides of the insulator plates 10a without using the chip parts.

Figure 15:
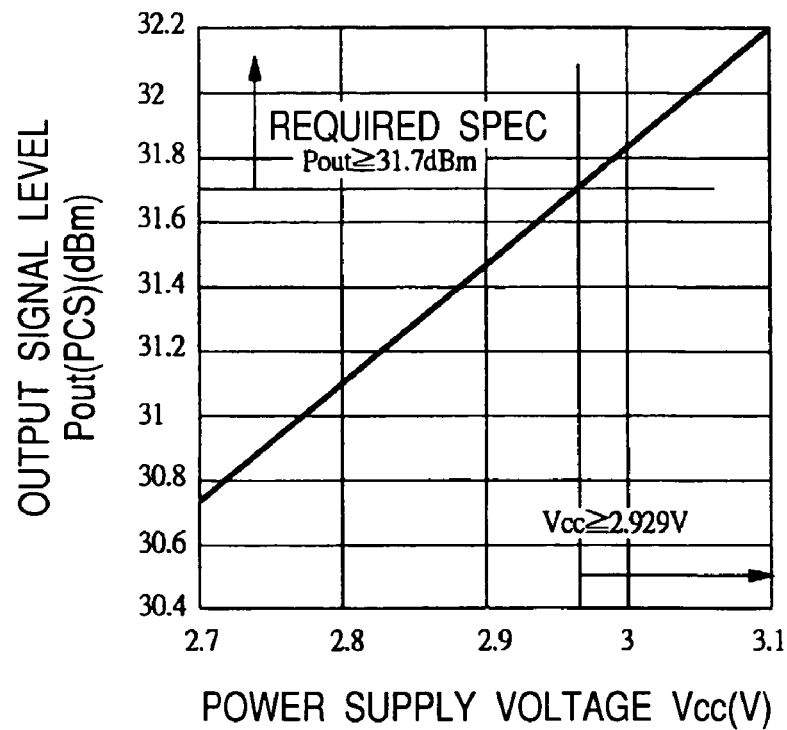
FIG. 15 is a graph illustrating the relationship between an internal power supply voltage and a phase information output signal of the semiconductor device.

FIG. 15 is a graph showing the relationship between a power supply voltage Vcc of a power module and a phase information output signal Pout (GSM1900). A voltage drop Vdrop developed in the Vcc-controlled circuit can be expressed as follows by reference to FIG. 4. That is, Vdrop=Vdd−Vcc and Vdrop=Vsat+(RA+RB)Idd. Therefore, RA+RB=(Vdd −Vcc −Vsat)/Idd. In the present embodiment 1, Vdd=3.1V, Idd=2.3A and Vsat=0.052V. In the present embodiment 1, the series resistor (RA+RB) of the wiring of the module board MCB can be set to less than or equal to 52 mΩ owing to the structure referred to above. Thus, since the power supply voltage Vcc can be set to greater than or equal to 2.929V from the above expression, the output level of the phase information output signal Pout can be set to, for example, greater than or equal to 31.7 dB of the required spec, as shown in FIG. 15. Accordingly, even if the power supply voltage Vdd that is supplied to the switch chip Csw is lowered to some extent due to, for example, the consumption of the battery power of a digital cellular phone, the output of the power module PM can be ensured, thereby making it possible to reduce the rate of occurrence of a defective condition in which a radio wave cannot reach a base station due to insufficient transmission power of the digital cellular phone.

Figure 16:
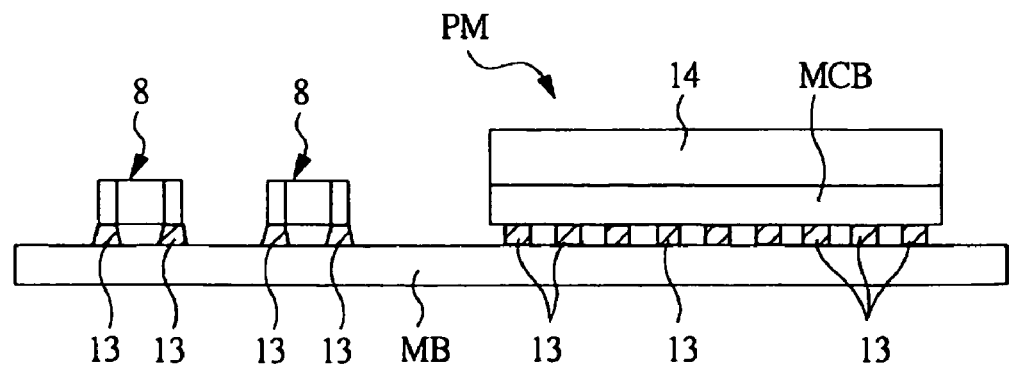
FIG. 16 is a side view showing a state in which the semiconductor device illustrative of one embodiment of the present invention is mounted on a mother board.

FIG. 16 shows a side view of the power module PM in a state in which it has been packaged on a motherboard MB of a digital cellular phone. The motherboard MB comprises a printed wiring board or the like having, for example, a multilayered wiring structure. The power module PM as well as a plurality of chip parts 8 are mounted over the main surface of the motherboard MB. The power module PM is mounted over the motherboard MB in a state in which the electrodes CE and wirings CLG of the back surface of the module board MCB are opposed to the main surface of the motherboard MB. The electrodes CE of the power module PM and the electrodes of the wirings CLG thereof and chip parts 8 are bonded and electrically connected to their corresponding electrodes of the motherboard MB via bonding materials 13. Incidentally, the chips Cam1, Cam2, Cam3 and Csw of the power module PM and the chip parts 8 are encapsulated by the encapsulating member 14, which comprises, for example, silicon rubber or the like.

Figure 17:
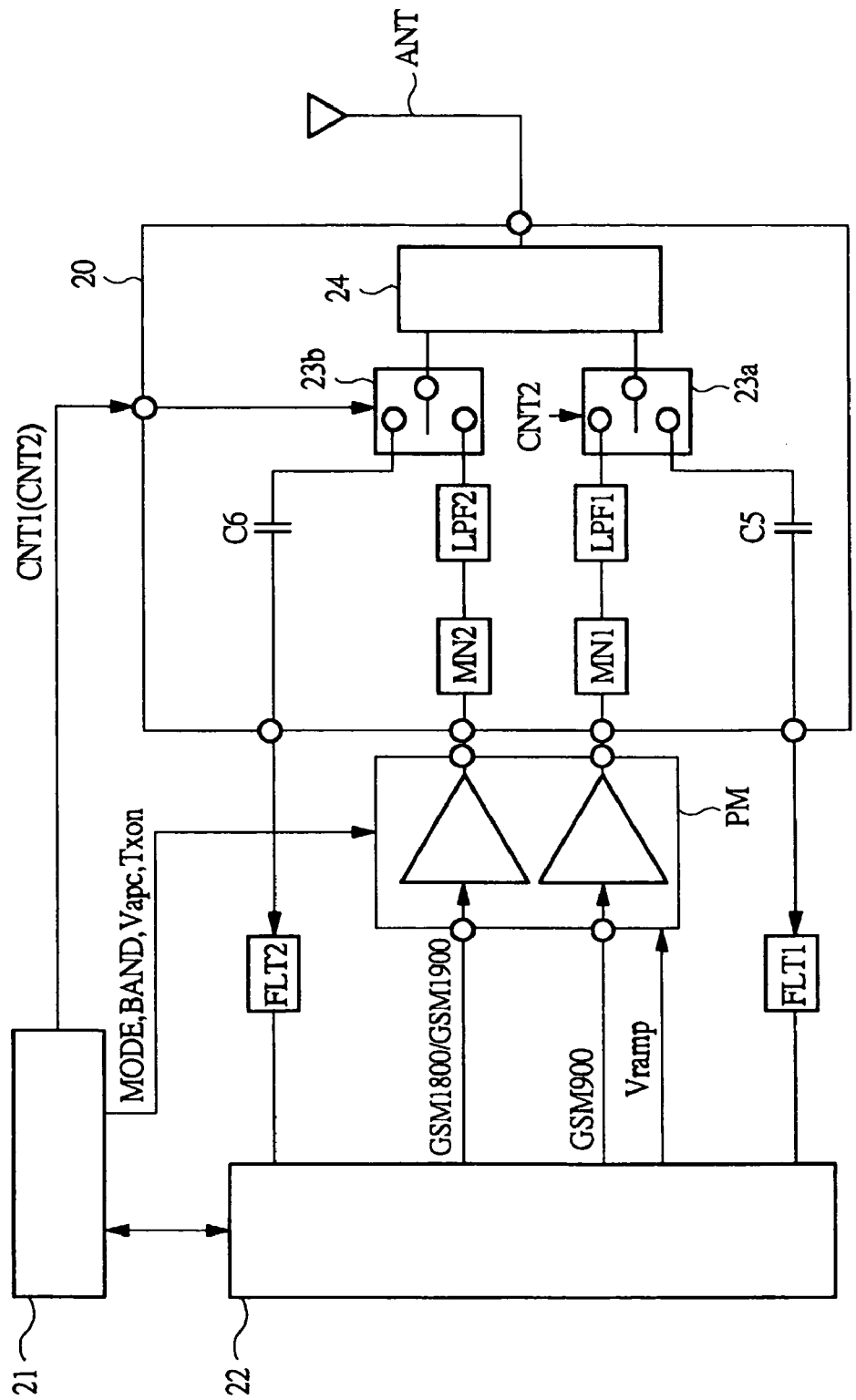
FIG. 17 is a schematic circuit diagram illustrating one example of a cellular phone system using the semiconductor device illustrative of one embodiment of the present invention.

FIG. 17 shows one example of a digital cellular phone system using the power module PM according to the present embodiment 1. Symbol ANT in FIG. 17 indicates an antenna which transmits and receives a signal wave. Reference numeral 20 indicates a front-end module, reference numeral 21 indicates the baseband circuit which converts an audible or voice signal to a baseband signal, converts a receive signal to an audible signal and generates a modulation scheme switching signal or a band switching signal, reference numeral 22 indicates a modulator/demodulator circuit which down-converts the receive signal and thereby demodulates it to generate a baseband signal and modulates a transmit signal, and FLT1 and FLT2 respectively indicate filters which eliminate noise and an interference wave from the received signal.

The filter FLT1 is used for GSM and the filter FLT2 is used for DCS. The baseband circuit 21 comprises a plurality of semiconductor integrated circuits, such as a DSP (Digital Signal Processor) or a microprocessor, a semiconductor memory, etc. The front-end module 20 includes impedance matching circuits MN1 and MN2, low-pass filters LPF1 and LPF2, switch circuits 23a and 23b, capacitors C5 and C6, and a duplexer 24. The impedance matching circuits MN1 and MN2 are circuits connected to their corresponding transmit output terminals of the power module PM to perform impedance matching. The low-pass filters LPF1 and LPF2 are circuits which attenuate harmonics. The switch circuits 23a and 23b are switch circuits for transmit-receive switching. The capacitors C5 and C6 are elements which cut dc components from the receive signal. The duplexer 24 is a circuit which performs division into a signal lying in a GSM900 band and a signal lying in GSM1800/GSM1900. These circuits and elements are mounted on one wiring board, which is configured as a module. Incidentally, switch or changeover signals CNT1 and CNT2 of the switch circuits 23a and 23b are supplied from the baseband circuit 21.

Embodiment 2

An embodiment 2 will be explained for a case in which the switch chip is placed on the center of a module board.

Figure 18:
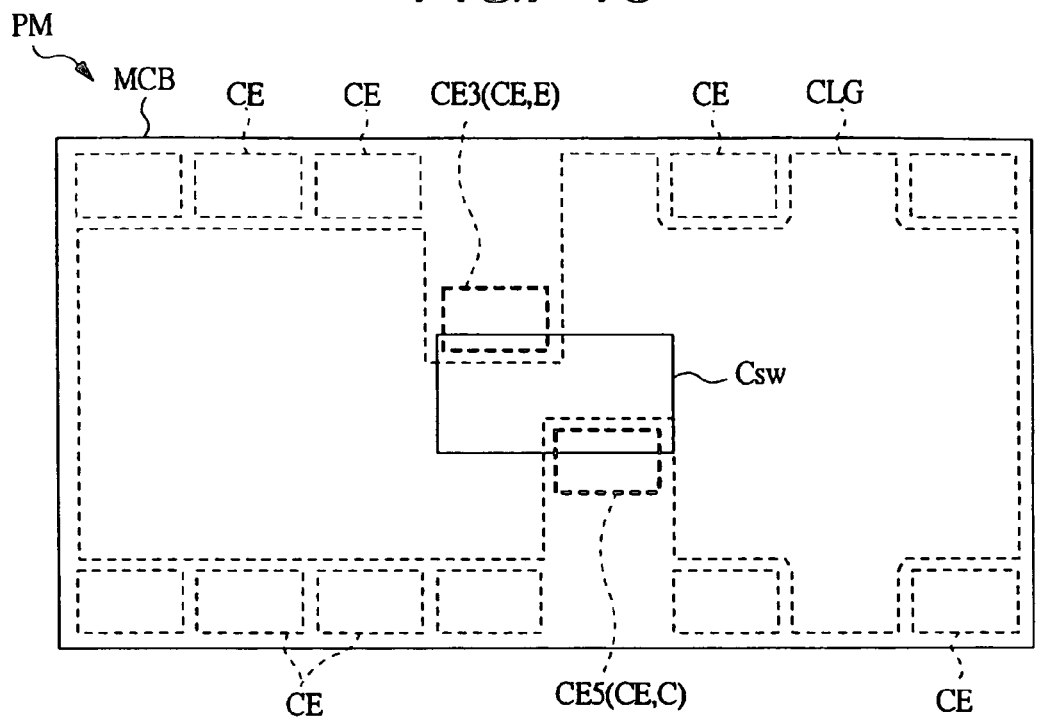
FIG. 18 is a plan view showing a main surface of a wiring board of a semiconductor device illustrating another embodiment of the present invention.
Figure 19:
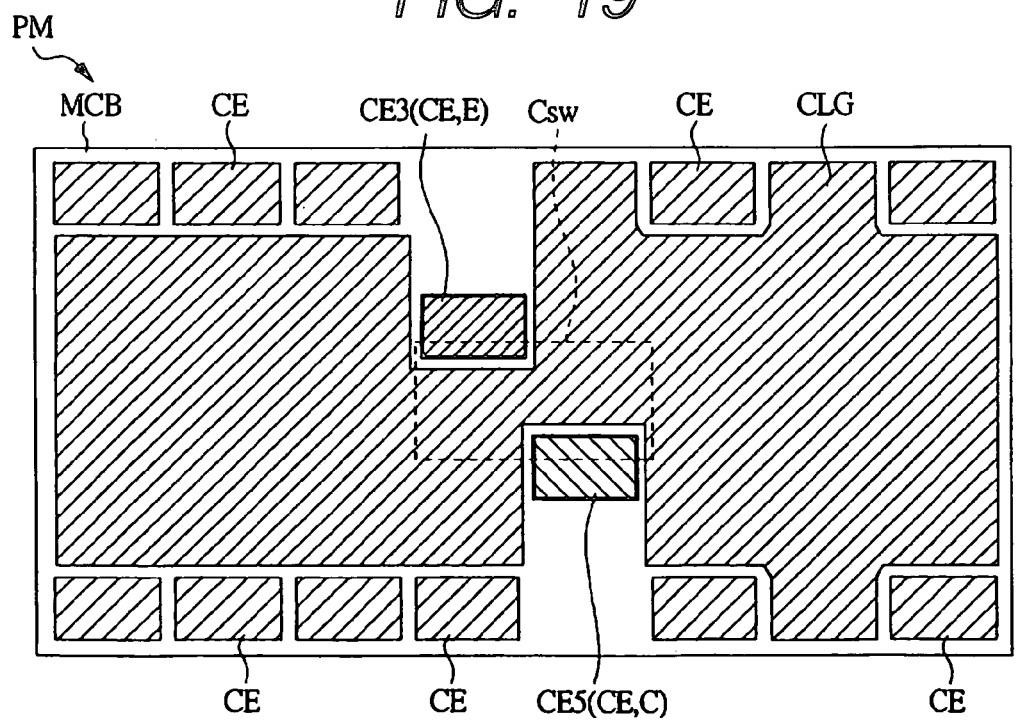
FIG. 19 is a plan view illustrating a back surface of the wiring board of the semiconductor device shown in FIG. 18.

FIGS. 18 and 19 respectively show plan views of a main surface and a back surface of a module board MCB of a power module PM according to the present embodiment 2. In the present embodiment 2, a switch chip Csw is placed in substantially the center of the module board MCB. In this case, electrodes CE3 and CE5 for power supply voltages Vdd and Vcc on the back surface of the module board MCB are also disposed below the chip Csw. That is, the electrodes CE3 and CE5 are also placed in substantially the center of the back surface of the module board MCB. Incidentally, open areas are provided at parts of a reference potential supply wiring CLG of the back surface of the module board MCB. The electrodes CE3 and CE5 are disposed in corresponding open areas. Thus, the electrodes CE3 and CE5 and the wiring CLG are insulated from one another.

Owing to such a configuration, the length of wiring on the module board MCB, which connects an emitter electrode E of the chip Csw and the electrode CE3 for the power supply voltage Vdd, and the length of wiring on the module board MCB, which connects a collector electrode C of the chip Csw and the electrode CE5 for the power supply voltage Vcc, can be shortened. It is therefore possible to reduce the resistance of the wiring resistors RA and RB. Accordingly, the output characteristic of the power module PM can be improved.

Even in the present embodiment 2, in a manner similar to the embodiment 1, a wiring path (viahole VH and wiring CL) of the module board MCB, which connects the emitter electrode E of the chip Csw and the electrode CE3 of the back surface of the module board MCB, and a wiring path (viahole VH and wiring CL) of the module board MCB, which connects the collector electrode C of the chip Csw and the electrode CE5 of the back surface of the module board MCB, may of course be configured as plural paths. Thus, the wiring resistors RA and RB can be further lowered. Accordingly, an effect similar to the embodiment 1 can be obtained.

Embodiment 3

An embodiment 3, representing will explain a modification of a wiring path which connects an emitter electrode of a switch chip of a power module and an emitter electrode placed on a back surface of a module board, will be explained.

Figure 20:
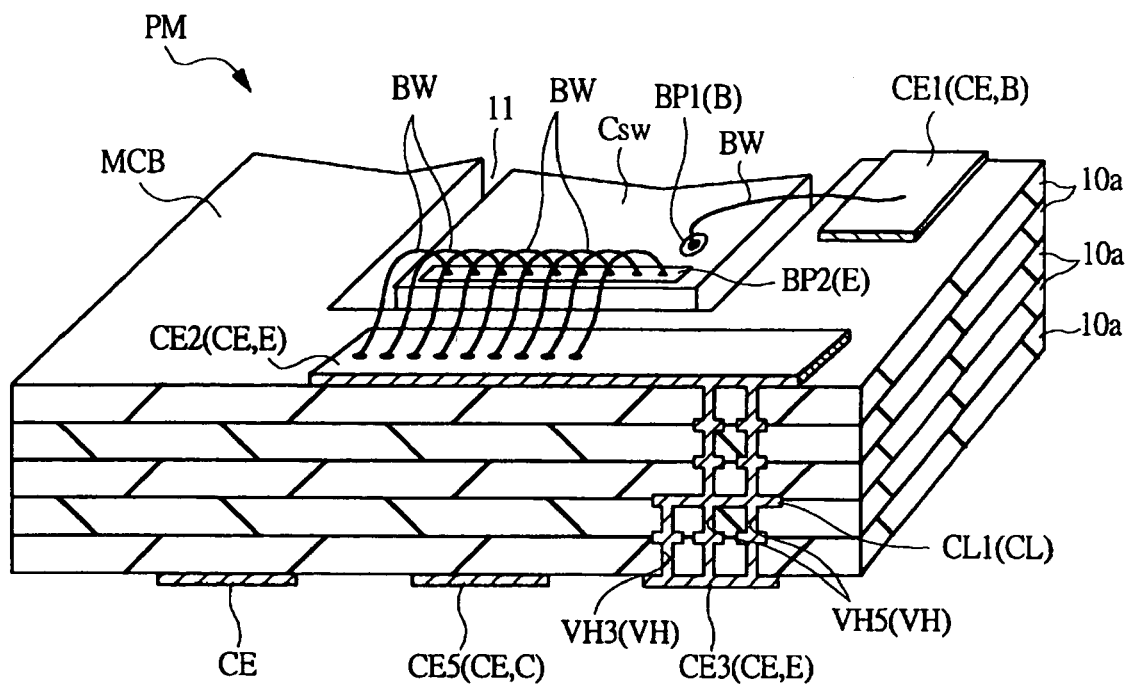
FIG. 20 is a partly broken-away perspective view depicting a semiconductor device according to a further embodiment of the present invention.

FIG. 20 shows a partly broken-away perspective view of a power module PM according to the present embodiment 3. In the present embodiment 3, an electrode CE2 on a main surface of a module board MCB and an electrode CE3 on a back surface of the module board MCB are electrically connected to each other via a plurality of via holes VH5 (VH) which extend substantially linearly in the thickness direction from the main surface of the module board MCB to the back surface thereof. According to the present embodiment 3, since a wiring path which connects the electrode CE2 of the main surface of the module board MCB and the electrode CE3 of the back surface of the module board MCB becomes linear without twists and turns, the full length of the wiring path can be shortened as compared with the embodiment 1. Therefore, the resistance of a wiring resistor RA can be lowered as compared with the embodiment 1. It is thus possible to further improve the output characteristic of the power module PM.

Embodiment 4

An embodiment 4, representing a modification of the layout of the via holes, will be explained.

Figure 21:
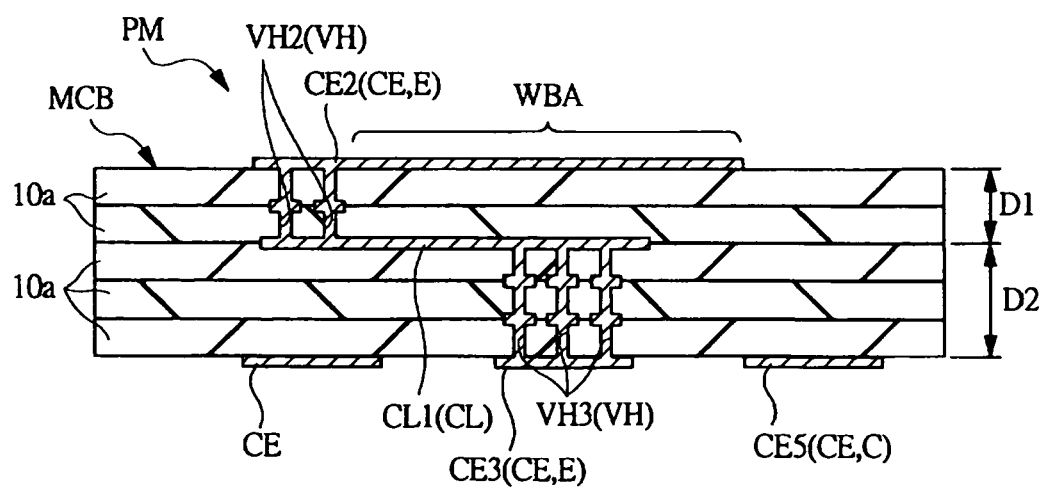
FIG. 21 is a fragmentary cross-sectional view showing a still further embodiment of the present invention.

FIG. 21 shows a fragmentary sectional view of a module board MCB of a power module PM according to the present embodiment 4. Symbol WBA indicates a bonding area for wires BW. A length D1 indicates the distance (thickness) from a main surface of the module board MCB to a wiring layer in which a wiring CL1 is provided, and a length D2 indicates the distance (thickness) from the wiring layer in which the wiring CL1 is disposed to a back surface of the module board MCB. A case where the length D1 <length D2 is illustrated as an example here.

In the present embodiment 4, two via holes VH2 are disposed between an electrode CE2 on the main surface of the module board MCB and the wiring CL1, and three via holes VH3 are disposed between the wiring CL1 and an electrode CE3 on the back surface of the module board MCB. That is, in the present embodiment 4, the number of via holes VH3 placed at the position of the relatively long length D2 is set to be greater than the number of via holes VH2 placed at the position of the relatively short length D1. According to the present embodiment 4, as described above, the number of via holes VH3 placed at the spot where the wiring length becomes long is set so as to be greater than the number of via holes VH2 placed at the spot where the wiring length becomes long, thereby making it possible to suppress an increase in the wiring resistance component at the spot where the wiring length becomes long, and reduce the resistance of wiring resistor RA between the electrodes CE2 and CE3.

Embodiment 5

Figure 22:
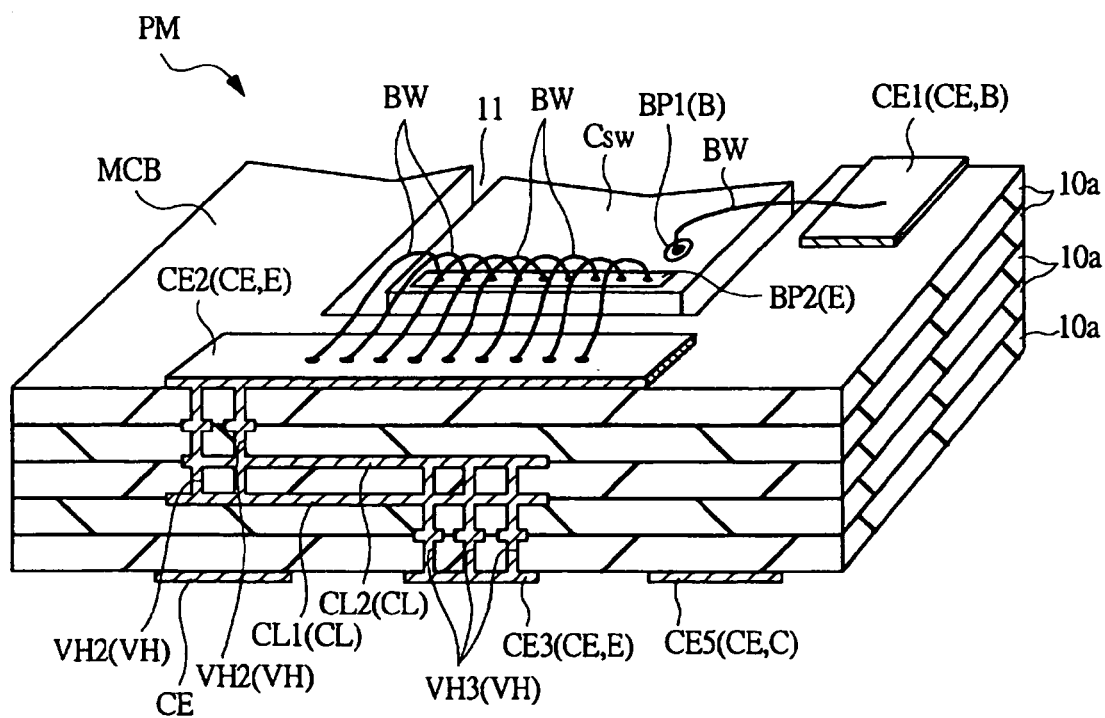
FIG. 22 is a partly broken-away perspective view illustrating a semiconductor device according to a still further embodiment of the present invention.

An embodiment 5, representing a modification of the layout of wirings in a module board, will be explained. FIG. 22 shows a partly broken-away perspective view of a power module PM according to the present embodiment 5. In the present embodiment 5, a wiring CL2 is added to a wiring path between electrodes CE2 and CE3. That is, the electrode CE2 on a main surface of a module board MCB is electrically connected to both of the corresponding two wirings CL1 and CL2 through two via holes VH2. The wirings CL1 and CL2 are formed in different wiring layers of the module board MCB and are electrically connected to the electrode CE3 on a back surface of the module board MCB through three via holes VH3. A wiring path for connecting a collector electrode C (CE4) on a back surface of a chip Csw and an electrode CE5 on the back surface of the module board MCB may be configured with a structure similar to the above.

According to the present embodiment 5, since the resistance of the wiring resistors RA and RB can further be reduced owing to the addition of the wiring CL2, as described above, the output characteristic of the power module PM can be further improved.

Although the invention made above by the present inventors has been described specifically based on various illustrative embodiments, the present invention is not limited to the embodiments. It is needless to say that various changes can be made thereto within a scope not departing from the gist thereof.

Although three stages of amplifier circuit parts of the power module are considered in the embodiments 1 through 5, for example, a two-stage configuration or a four-stage configuration may be adopted.

Although the embodiments 1 through 5, respectively, are directed to a case in which two amplifier circuit parts of the power module are formed in one semiconductor chip and other amplifier circuit parts are formed in another semiconductor chip, the invention is not limited to such a configuration. All of the three amplifier circuit parts may be formed in one semiconductor chip.

Although the embodiments 1 through 5, respectively, are directed to a case in which the invention is applied to a triple band system capable of handling the three frequency bands of GSM900, GSM1800 and GSM1900, the invention may be applied to a so-called dual band system capable of handling radio waves lying in the two frequency bands of the GSM900 and GSM1800.

While the above description has been principally directed to a case in which the invention made by the present inventors is applied to a digital cellular phone, which belongs to the field of application reaching the background of the invention, the present invention is not limited to it. The present invention can be applied even to a mobile information processing device, such as, for example, a PDA (Personal Digital Assistants) or the like, and an information processing device, such as a personal computer or the like having a communication function.

Advantageous effects obtained by a typical one of the features of the invention disclosed by the present application will be described in brief as follows:

A semiconductor device includes a first semiconductor chip including a transistor serving as a switching element of a power supply control circuit, a second semiconductor chip including an amplifier circuit to which a power supply voltage is supplied from the power supply control circuit operating as a source or power supply, and a wiring board having the first and second semiconductor chips mounted on its main surface. Connecting portions extending in the direction intersecting main and back surfaces of the wiring board are provided in a wiring path of the wiring board, which connects each of the power supply electrodes of the first semiconductor chip and its corresponding power supply electrode on the back surface of the wiring board. Further, a plurality of the connecting portions are bonded to the power supply electrode of the first semiconductor chip and the power supply electrode on the back surface of the wiring board. Thus, the output characteristic of the semiconductor device can be improved.

What is claimed is:

1. A semiconductor device, comprising:
   a first semiconductor chip including a bipolar transistor which constitutes a power supply control circuit that converts a first voltage to a second voltage;
   a second semiconductor chip including an amplifier circuit using the second voltage as a power supply; and
   a wiring board equipped with the first and second semiconductor chips,
   wherein the wiring board includes a first surface over which the first and second semiconductor chips are mounted, and a second surface provided at the side opposite to the first surface,
   wherein a first electrode for an emitter electrode of the bipolar transistor and a second electrode for a collector electrode of the bipolar transistor are provided over the first surface,
   wherein a third electrode for the first voltage and a fourth electrode for the second voltage are provided over the second surface, and
   wherein connecting portions extending in the direction intersecting the first and second surfaces of the wiring board are provided in a wiring path in the wiring board, which electrically connects the first electrode of the first surface and the third electrode of the second surface to each other, and a plurality of the connecting portions are bonded to the first electrode and the third electrode.

2. A semiconductor device according to claim 1, wherein connecting portions extending in the direction intersecting the first and second surfaces of the wiring board are provided in a wiring path in the wiring board, which electrically connects the second electrode of the first surface and the fourth electrode of the second surface to each other, and a plurality of the connecting portions are bonded to the second electrode and the fourth electrode.

3. A semiconductor device according to claim 1, wherein the emitter electrode provided in the first semiconductor chip and the first electrode of the wiring board are electrically connected to each other by bonding wires.

4. A semiconductor device according to claim 3, wherein each of the bonding wires is bonded to an area of the first electrode, to which the connecting portions are not bonded.

5. A semiconductor device according to claim 1, wherein the wiring board is built in a cellular phone.

6. A semiconductor device according to claim 1, wherein the amplifier circuit is adaptable to amplification of signals lying in a plurality of frequency bands.

7. A semiconductor device according to claim 6, wherein the plurality of frequency bands are a 900 MHz band, a 1800 MHz band and a 1900 MHz band.

8. A semiconductor device according to claim 1, wherein a plurality of the connecting portions bonded to the first electrode and the third electrode are respectively provided in a state in which they extend linearly so as to reach from the first electrode to the third electrode.

9. A semiconductor device according to claim 1, wherein a wiring extending in the direction along the first and second surfaces of the wiring board is provided in the wiring path which electrically connects the first electrode of the first surface and the third electrode of the second surface to each other, and a wiring path length of each of the first electrode and the wiring is shorter than the length equivalent to the lengths of three of a plurality of electrodes including the third and fourth electrodes disposed over the second surface of the wiring board.

10. A semiconductor device according to claim 1, wherein the third electrode of the second surface of the wiring board is provided directly below the emitter electrode of the first semiconductor chip over the first surface.

11. A semiconductor device according to claim 1, wherein the connecting portions are formed by providing a conductor film into viaholes defined in the wiring board.

* * * * *